United States Patent
Watanabe et al.

(10) Patent No.: US 11,888,475 B2
(45) Date of Patent: Jan. 30, 2024

(54) INTEGRATED CIRCUIT, CIRCUIT BOARD, AND ELECTRONIC APPARATUS

(71) Applicant: Oki Electric Industry Co., Ltd., Tokyo (JP)

(72) Inventors: Keisuke Watanabe, Tokyo (JP); Yohei Ogawa, Tokyo (JP); Yukio Ito, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 17/748,798

(22) Filed: May 19, 2022

(65) Prior Publication Data

US 2022/0385289 A1 Dec. 1, 2022

(30) Foreign Application Priority Data

May 24, 2021 (JP) ................................. 2021-087037
Oct. 26, 2021 (JP) ................................. 2021-174914

(51) Int. Cl.
| | | |
|---|---|---|
| H03K 19/00 | (2006.01) | |
| H05K 1/02 | (2006.01) | |
| H03K 19/003 | (2006.01) | |
| H01L 23/64 | (2006.01) | |

(52) U.S. Cl.
CPC ... *H03K 19/0005* (2013.01); *H03K 19/00369* (2013.01); *H05K 1/0246* (2013.01); *H01L 23/64* (2013.01)

(58) Field of Classification Search
None
See application file for complete search history.

(56) References Cited

U.S. PATENT DOCUMENTS

2017/0125092 A1* 5/2017 Hirashima ............ G11C 7/1084

FOREIGN PATENT DOCUMENTS

JP 2004-45481 A 2/2004

* cited by examiner

*Primary Examiner* — Jany Richardson
(74) *Attorney, Agent, or Firm* — METROLEX IP LAW GROUP, PLLC

(57) ABSTRACT

An integrated circuit according to one or more embodiments may include a terminal to which an impedance element and a power supply having a predetermined potential can be connected. The integrated circuit may be configured to change a potential of one of electrodes of the impedance element connected to the terminal, detect a change in electrical characteristics of the terminal based on characteristics of the impedance element when the potential of the one electrode of the impedance element is changed, to determine a setting condition among a plurality of setting conditions that are used for an operation of the integrated circuit, store the setting condition in a storage, and use the setting condition stored in the storage for the operation of the integrated circuit.

15 Claims, 15 Drawing Sheets

FIG. 16
| MOUNTING POSITION FOR RESITOR | READ VALUE AT FIRST TIME POINT | READ VALUE AT THIRD TIME POINT | READ VALUE AT FOURTH TIME POINT | READ VALUE AT FIFTH TIME POINT | SET VALUE |
|---|---|---|---|---|---|
| RESISTOR MOUNTING POSITION MPu | 1 | 1 | 1 | 1 | 7 |
| | 1 | 0 | 1 | 1 | 6 |
| | 1 | 0 | 0 | 1 | 5 |
| | 1 | 0 | 0 | 0 | 4 |
| RESISTOR MOUNTING POSITION MPl | 0 | 1 | 1 | 1 | 3 |
| | 0 | 1 | 1 | 0 | 2 |
| | 0 | 1 | 0 | 0 | 1 |
| | 0 | 0 | 0 | 0 | 0 |
TB1
FIG. 17
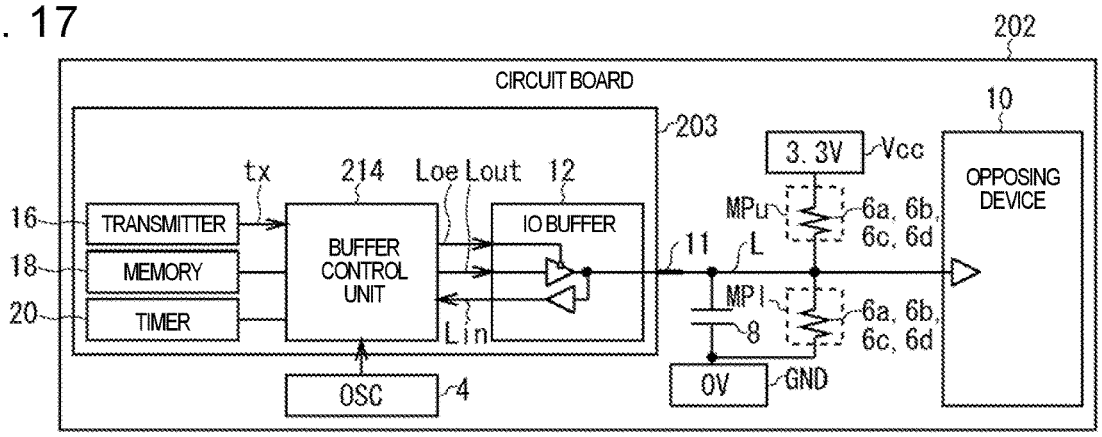
FIG. 18
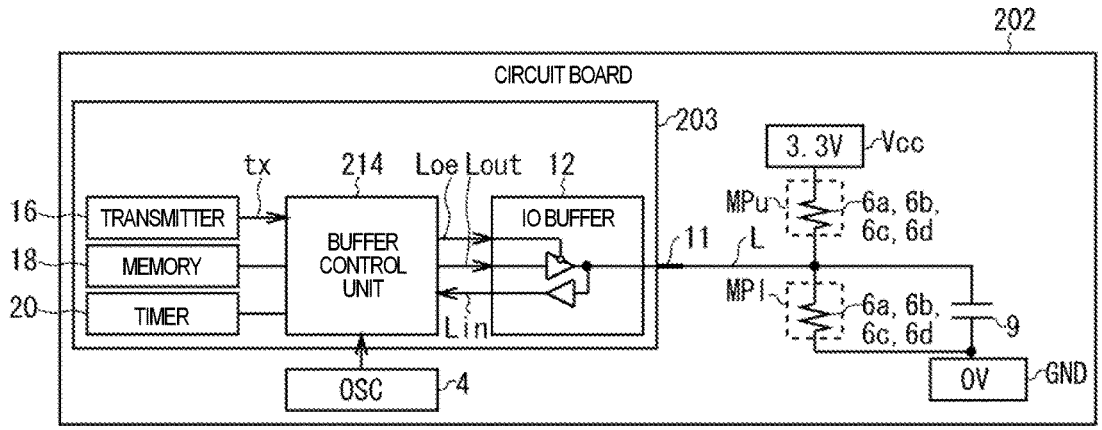

| MOUNTING POSITION FOR RESITOR | READ VALUE AT FIRST TIME POINT | LOGIC LEVEL REVERSAL TIME [μsec] | SET VALUE |
|---|---|---|---|
| RESISTOR MOUNTING POSITION MPU | 1 | Tu<80 | 7 |
| | | 80≦Tu<400 | 6 |
| | | 400≦Tu<1500 | 5 |
| | | Tu≧1500 | 4 |
| RESISTOR MOUNTING POSITION MPU | 0 | Tu≧1500 | 3 |
| | | 400≦Tu<1500 | 2 |
| | | 80≦Tu<400 | 1 |
| | | Tu<80 | 0 |

INTEGRATED CIRCUIT, CIRCUIT BOARD, AND ELECTRONIC APPARATUS

CROSS REFERENCE TO RELATED APPLICATIONS

This application claims priority based on 35 USC 119 from prior Japanese Patent Applications No. 2021-087037 filed on May 24, 2021 and No. 2021-174914, filed on Oct. 26, 2021, entitled "INTEGRATED CIRCUIT, CIRCUIT BOARD, AND ELECTRONIC APPARATUS", the entire contents of all of which are incorporated herein by reference.

BACKGROUND

The disclosure may relate to an integrated circuit, a circuit board, and an electronic apparatus, and may be suitable for application to an integrated circuit mounted on a circuit board in an image formation apparatus, for example.

In a related art, it may be a common practice, in a semiconductor integrated circuit, to set a terminal, which is normally used as an output terminal, to a high impedance state when a power is turned on, and read a potential (1 or 0) of the terminal effected by a pull-up resistor or a pull-down resistor connected to the terminal, and use the read value as a set value to be used for operation of an integrated circuit (IC) chip of the semiconductor integrated circuit (see, for example, Patent Document 1: Japanese Patent Application Publication No. 2004-45481).

SUMMARY

In such a semiconductor integrated circuit, a number of pins available for acquiring information may not be sufficient depending on the circuit configuration. However, even in such a case, the semiconductor integrated circuit could only take in one bit of information per pin, and thus a sufficient number of settings could not be ensured.

An object of an embodiment of the disclosure may be to provide an integrated circuit, a circuit board, and an electronic apparatus that can improve functionality.

A first aspect of the disclosure may be an integrated circuit that may include: a terminal configured to be connected to an impedance element and a power supply having a predetermined potential, wherein the integrated circuit is configured to change a potential of one of electrodes of the impedance element connected to the terminal, detect a change in electrical characteristics of the terminal based on characteristics of the impedance element when the potential of the one electrode of the impedance element is changed, to determine a setting condition among a plurality of setting conditions that are used for an operation of the integrated circuit, store the set condition in a storage, and use the set condition stored in the storage for the operation of the integrated circuit.

A second aspect of the disclosure may be a circuit board that may include: the integrated circuit according to the first aspect; the impedance element connected to the terminal of the integrated circuit; and the power supply connected to the impedance element.

A third aspect of the disclosure may be an electronic apparatus that may include the circuit board according to the second aspect described above.

According to one or more aspects described above, the integrated circuit can read (determine) one setting condition among a plurality of setting conditions, by one of impedance elements, whose electrical characteristics are different from each other, being selectively mounted to a same impedance element mounting position.

According to one or more aspects described above, it is possible to realize an integrated circuit, a circuit board, and an electronic apparatus that can improve functionality.

BRIEF DESCRIPTION OF DRAWINGS

FIGS. 3A to 3D are block diagrams each illustrating a combination of a resistor mounting position and a resistor constant according to a first embodiment, wherein FIG. 3A illustrates a case in which a set value is 3, FIG. 3B illustrates a case in which the set value is 2, FIG. 3C illustrates a case in which the set value is 1, and FIG. 3D illustrates a case in which the set value is 0;

FIGS. 6A to 6D are diagrams each illustrating a timing chart of signals between an IO buffer control unit and an IO buffer according to a first embodiment, wherein FIG. 6A illustrates the timing chart in the case of the set value being 3, FIG. 6B illustrates the timing chart in the case of the set value being 2, FIG. 6C illustrates the timing chart in the case of the set value being 1, and FIG. 6D illustrates the timing chart in the case of the set value being 0;

FIGS. 10A to 10H are block diagrams each illustrating a combination of a resistor mounting position and a resistor constant according to second and third embodiments, wherein FIG. 10A illustrates a case in which the set value is 7, FIG. 10B illustrates a case in which the set value is 6, FIG. 10C illustrates a case in which the set value is 5, FIG. 10D illustrates a case in which the set value is 4, FIG. 10E illustrates a case in which the set value is 3, FIG. 10F illustrates a case in which the set value is 2, FIG. 10G illustrates a case in which the set value is 1, and FIG. 10H illustrates a case in which the set value is 0;

FIGS. 13A to 13D are timing charts of signals between an IO buffer control unit and an IO buffer according to second and third embodiments, wherein FIG. 13A illustrates the timing chart in a case of the set value being 7, FIG. 13B illustrates the timing chart in a case of the set value being 6, FIG. 13C illustrates the timing chart in a case of the set value being 5, and FIG. 13D illustrates the timing chart in a case of the set value being 4;

FIGS. 14A to 14D are timing charts of the signals between the IO buffer control unit and the IO buffer according to second and third embodiments, wherein FIG. 14A illustrates the timing chart in a case of the set value being 3, FIG. 14B illustrates the timing chart in a case of the set value being 2, FIG. 14C illustrates the timing chart in a case of the set value being 1, and FIG. 14D illustrates the timing chart in a case of the set value being 0;

FIG. 16 is a diagram illustrating a set value replacement correspondence table according to a second embodiment;

FIG. 17 is a block diagram illustrating a configuration of a circuit board according to a third embodiment;

FIG. 18 is a block diagram illustrating a configuration of an equivalent circuit of the circuit board according to a third embodiment, which is obtained by replacing a capacitor and an opposing device of the circuit board with a capacitor having an equivalent load capacitance thereof;

FIG. 20 is a diagram illustrating a set value replacement correspondence table according to a third embodiment.

DETAILED DESCRIPTION

Figure 1:
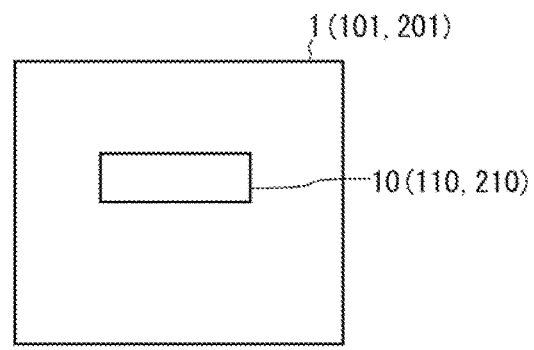
FIG. 1 is a diagram illustrating a view of a configuration of a printer according to one or more embodiments.

Descriptions are provided hereinbelow for one or more embodiments based on the drawings. In the respective drawings referenced herein, the same constituents are designated by the same reference numerals and duplicate explanation concerning the same constituents is omitted. All of the drawings are provided to illustrate the respective examples only.

(1. First Embodiment)

(1-1. Printer Configuration]

As illustrated in FIG. 1, a printer 1 is a color electrophotographic printer, for example. The printer is configured to print an image on paper or the like. The printer 1 includes various components, including a circuit board 2 illustrated in FIG. 2, inside a housing thereof. The printer 1 is controlled entirely by a semiconductor integrated circuit 3 mounted on the circuit board 2, for example.

(1-2. Configuration of Circuit Board)

Figure 2:
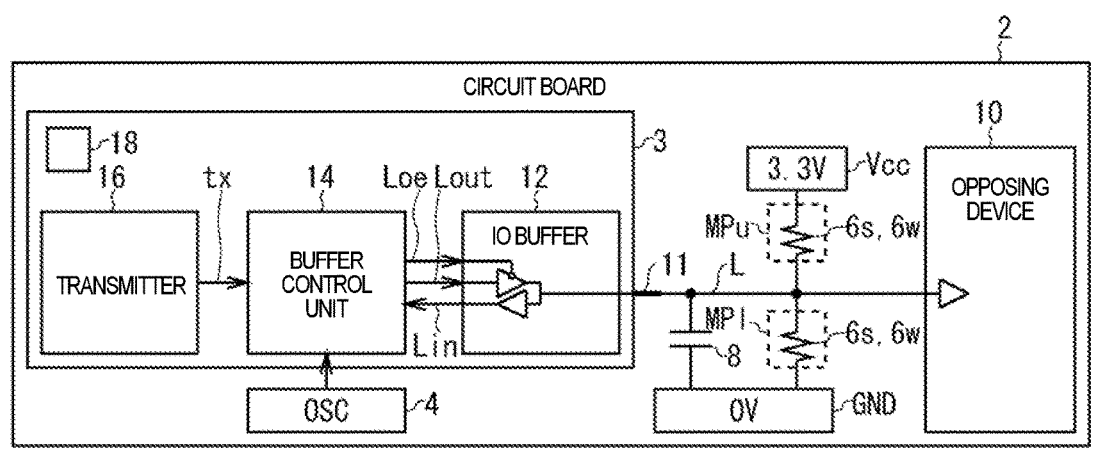
FIG. 2 is a block diagram illustrating a view of a configuration of a circuit board according to a first embodiment.

As illustrated in FIG. 2, the circuit board 2 is equipped with the semiconductor integrated circuit 3, an OSC4, a resistor 6 (6s or 6w), a capacitor 8, and an opposing device 10. The semiconductor integrated circuit 3 is configured in which a terminal 11, which is one of a plurality of terminals, is connected to a signal line L, which is connected to the opposing device 10. That is, the semiconductor integrated circuit 3 and the opposing device 10 are connected by the signal line L.

The semiconductor integrated circuit 3 is, for example, an ASIC (Application Specific Integrated Circuit) and includes an IO buffer 12, an IO buffer control unit 14, a transmitter 16, and a memory 18 (or a storage). The IO buffer 12 is an LVTTL (Low Voltage TTL) input/output buffer. Thresholds of the input potential of the LVTTL include a threshold Vil at which the input potential is determined to be a low level and a threshold Vih at which the input potential is determined to be a high level, wherein the threshold Vil is 0.8V (Low) and the threshold Vih is 2.0 V (High).

The IO buffer control unit 14 as a control unit or a controller is a logic circuit that controls the IO buffer 12. The IO buffer control unit 14 is connected to the 10 buffer 12 via three signal lines, which are signal lines Loe, Lout, and Lin. The 10 buffer control unit 14 outputs an OE signal and an OUT signal from the signal lines Loe and Lout and receives an IN signal from the signal line Lin serving as a signal input part. When the IO buffer control unit 14 puts the IO buffer 12 in a high impedance state (hereinafter may be referred to as a Hi-z state), the IO buffer control unit 14 outputs "0" which is the Low level of the OE signal to the signal line Loe (hereafter, may be referred to as "oe=0"), regardless of the state of the OUT signal. In the following, putting the IO buffer 12 into the high impedance state may be referred to as cutting off (stopping) the output of the signal line L (or opening the signal line L). When the IO buffer control unit 14 outputs "1" to the signal line L via the IO buffer 12, the IO buffer control unit 14 outputs "1" as the high level of the OE signal to the signal line Loe (hereafter may be referred to as "oe=1"), and outputs "1" as the high level of the OUT signal to the signal line Lout as a signal output part (hereinafter may be referred to as "out=1"). On the other hand, when the IO buffer control unit 14 outputs "0" to the signal line L via the IO buffer 12, the IO buffer control unit 14 outputs "1" as the high level of the OE signal to the signal line Loe ("oe=1") and outputs "0" as the Low level of the OUT signal to the signal line Lout (hereafter may be referred to as "out=0"). Further, the IO buffer control unit 14 reads a value of the IN signal by receiving the IN signal from the signal line Lin via the IO buffer 12.

The transmitter 16 is a logic circuit that transmits an output signal tx to the opposing device 10 in an original usage of the semiconductor integrated circuit 3. Upon outputting the output signal tx to the signal line L via the IO buffer 12, the 10 buffer control unit 14 transfers the signal control right of the IO buffer 12 to the transmitter 16, by outputting the output signal tx to the signal line Lout (hereinafter may be referred to as "out=tx") and setting to "oe=1".

The memory 18 is configured to store therein one of tset values (i.e., set value 3, set value 2, set value 1, and set value 0) that is read by the IO buffer control unit 14 through the terminal 11 and is to be used for an initial operation of the integrated circuit 3. The OSC4 is an oscillator and supplies a clock to the semiconductor integrated circuit 3. The clock frequency is 10 [MHz] (That is, the clock cycle is 0.1 μs).

The resistors 6 (6s, 6w) are resistor elements such as chip resistors. Only one of the resistors 6s and 6w is selectively mounted on either one of resistor mounting positions MPu and MPl (impedance element mounting positions or portions). In other words, the resistor 6 will not be mounted at both of the resistor mounting positions MPu and MPl. In the following, the resistors 6s and 6w may be referred to as resistors 6, and the resistor mounting positions MPu and MPl may be referred to resistor mounting positions MP as impedance element mounting positions. The resistor 6 mounted to the resistor mounting position MPu is connected to the signal line L at one of external electrodes thereof and is connected to 3.3 V, which is Vcc, at the other external electrode thereof. To the contrary, the resistor 6 mounted to the resistor mounting position MPl is connected to the signal line L at one of the external electrodes thereof and is connected to 0 V, which is GND, at the other external electrode thereof. A resistance constant Rs, which is a constant (i.e., resistance value) of the resistor 6s, is, for example, 2 k Ω. A resistance constant Rw, which is a constant (i.e., resistance value) of the resistor 6w, is, for example, 10 k Ω.

The capacitor 8 is composed of a chip capacitor or the like. The capacitor 8 is connected at one of external electrodes thereof to the signal line L and at the other external electrode thereof to 0 V and thus functions as a capacitive component between the signal line L and 0 V. A capacitance value C of the capacitor 8 is 50 pF. The opposing device 10 is a device that receives data output from the semiconductor integrated circuit 3.

(1-3. Combination of Resistor Mounting Position and Resistor Constant) FIGS. 3A, 3B, 3C and 3D illustrate combinations of the resistor mounting position M (MPu or MPI) at which the resistor 6 can be mounted on the circuit board 2, and the resistance constant R (Rs or Rw) of the resistor 6. The semiconductor integrated circuit 3 is configured to detect (read) from the signal line L one of four different set values of 3, 2, 1, and 0 according to one of four different combinations (four different patterns) of the resistor mounting position MP and the resistor constant R. In each of FIGS. 3A to 3D, the resistor mounting position MP and the resistance constant R and the set value read by the semiconductor integrated circuit 3 are as follows.

Figure 3A:
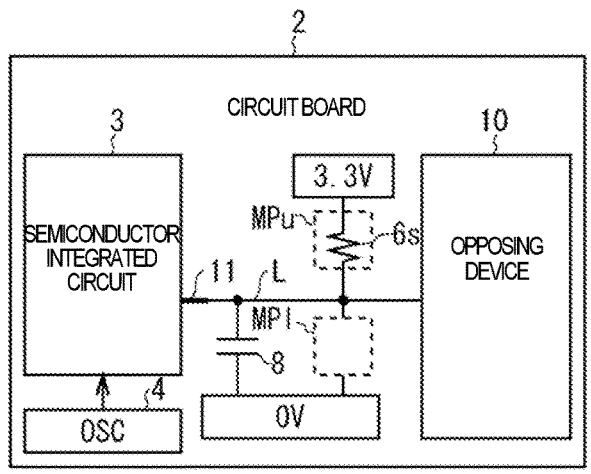

FIG. 3A: the resistor mounting position MPu, the resistance constant Rs, and the set value 3

Figure 3B:
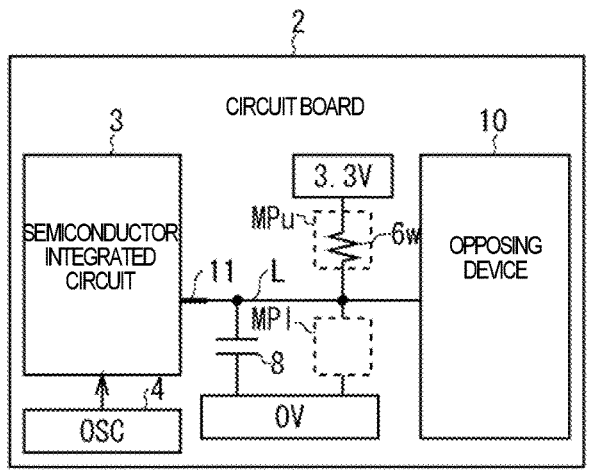

FIG. 3B: the resistor mounting position MPu, the resistance constant Rw, and the set value 2

Figure 3C:
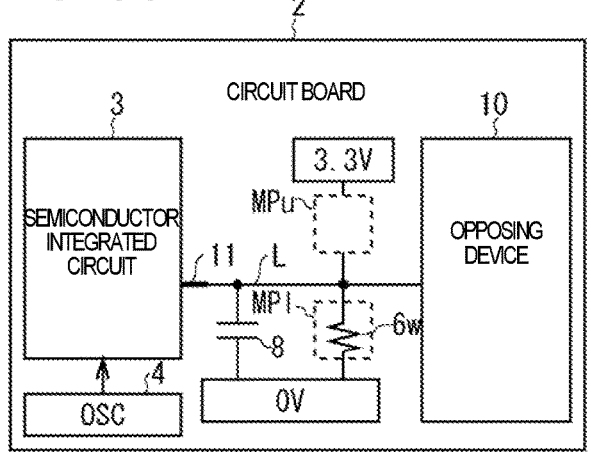

FIG. 3C: the resistor mounting position MPI, the resistance constant Rw, and the set value 1

Figure 3D:
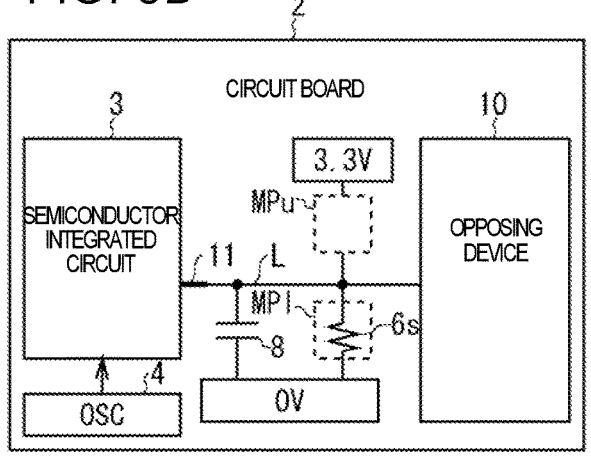

FIG. 3D: the resistor mounting position MPI, the resistance constant Rs, and the set value 0

That is, for example, in the case illustrated in FIG. 3A in which the resistor 6s having the resistor constant Rs is mounted at the resistor mounting position MPu and no resistor is mounted at the resistor mounting position MPI, the semiconductor integrated circuit 3 reads the set value of 3.

As described above, the resistor mounting positions MPu and MPI are provided as follows.

The resistor mounting position MPu: between the signal line L and 3.3 V.

The resistor mounting position MPI: between the signal line L and 0 V.

Furthermore, as described above, the resistance constants Rs and Rw are as follows.

The resistance constant Rs: 2 kΩ

The resistance constant Rw: 10 kΩ

(1-4. Relationship Between Elapsed Time and Potential of Signal Line)

(1-4-1. Case where the Resistor 6s or 6w is Mounted at the Resistor Mounting Position MPu)

Figure 4:
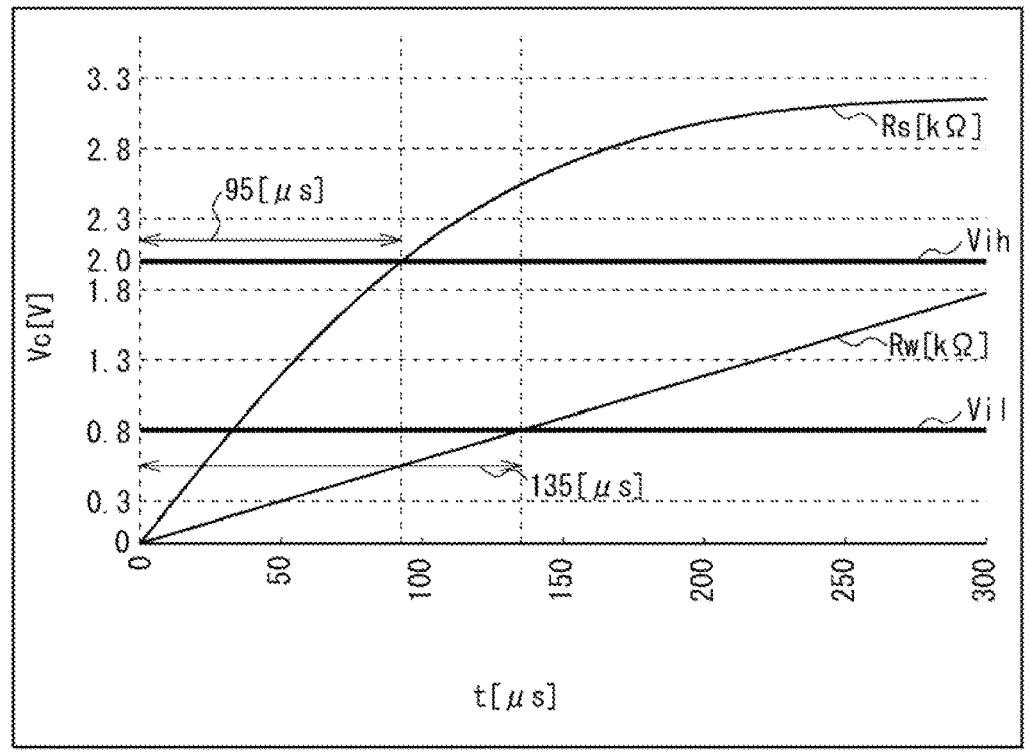
FIG. 4 is a graph illustrating a relationship between a potential Vc of a signal line L and an elapsed time in a case where a resistor Rs or Rw is mounted at a resistor mounting position MPI according to a first embodiment.

FIG. 4 illustrates a graph illustrating a change in the potential of the potential Vc of the signal line L, starting from L=0 V in the state where the IO buffer 12 is in the high impedance state (in the setting "oe=0") in the case where the resistor 6s or 6w is mounted to the resistor mounting position MPu, which is calculated by using a step response calculation formula for an RC circuit. In the graph of FIG. 4, the constant of the resistor 6 that can be mounted at the resistor mounting position MPu is the resistance constant Rs (2 k Ω) or Rw (10 k Ω). In FIG. 4, the potential changes in these two cases are illustrated. The potential Vc of the signal line L is expressed by the following equation (1) in relation with the time t (seconds) from the start.

$$Vc(t) = 3.3 * \left(1 - e^{\left(-\frac{t}{T}\right)}\right) \quad (1)$$

Here, "e" is the Napier number (2.718 . . . ) and "T" is the time constant (in seconds). In the case of the resistance constant Rs (2 k Ω), the value of "T" is expressed by the following equation (2), and in the case of the resistance constant Rw (10 k Ω), the value of "T" is expressed by the following equation (3).

$$\tau = C*Rs = 50*10^{-9}*2*10^{3} = 100*10^{-6} = 100[\mu s] \quad (2)$$

$$\tau = C*Rw = 50*10^{-9}*10*10^{3} = 500*10^{-6} = 500[\mu s] \quad (3)$$

As illustrated in the graph of FIG. 4, it can be seen that, in the case of the resistance constant Rs (2 k Ω), at the latest the time of 95 μs, the potential Vc of the signal line L exceeds the threshold Vih (2 V), which means that the IO buffer 12 reads "1" from the signal line L at the latest the time of 95 μs. On the other hand, it can be seen that, in the case of the resistance constant Rw (10 k Ω), the potential Vc of the signal line L does not exceed the threshold Vil (0.8 V) until the time of 135 μs at the earliest, which means that the IO buffer 12 reads "0" from the signal line L until the time of 135 μs at the earliest. For example, 115 μs after the IO buffer 12 starts in the high impedance state ("oe=0"), the IO buffer 12 reads "1" from the signal line L in the case of the resistance constant Rs (2 k Ω), and reads "0" from the signal line L in the case of the resistance constant Rw (10 k Ω).

(1-4-2. Case where the Resistor 6s or 6w is Mounted at the Resistor Mounting Position MPI)

Figure 5:
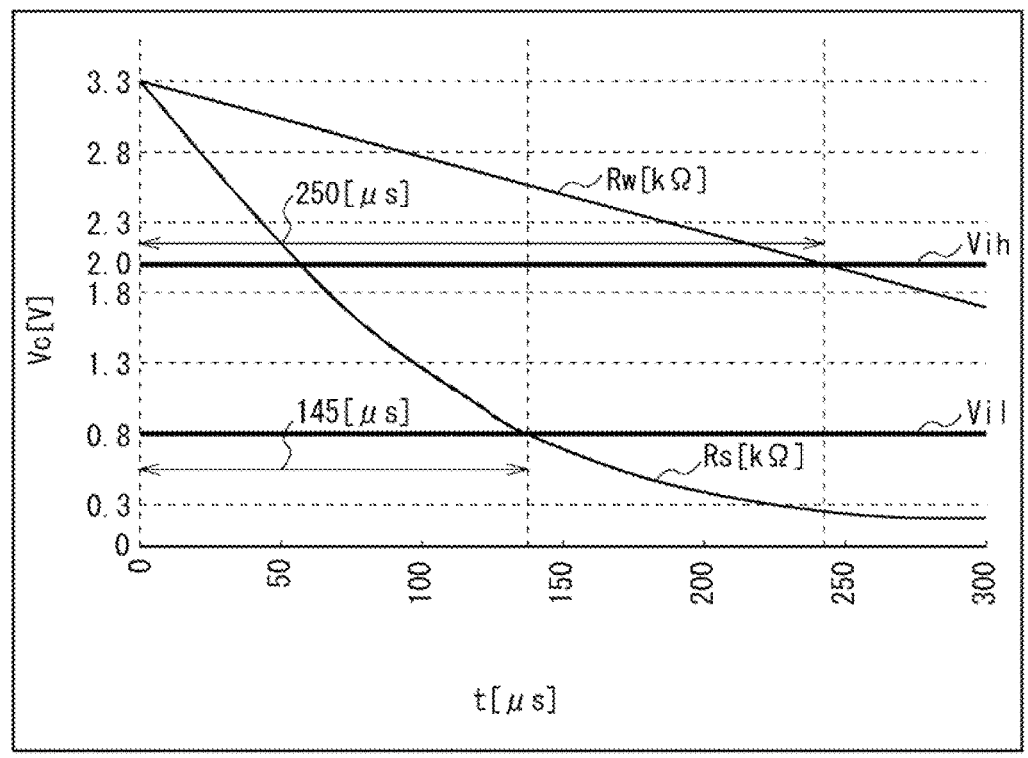
FIG. 5 is a graph illustrating a relationship between the potential Vc of the signal line L and the elapsed time in a case where the resistor Rs or Rw is mounted at a resistor mounting position MPI according to a first embodiment.

FIG. 5 illustrates a graph illustrating a change in the potential of the potential Vc of the signal line L, starting from L=3.3 V in the state where the IO buffer 12 is in the high impedance state (in the setting "oe=0") in the case where the resistor 6s or 6w is mounted to the resistor mounting position MPI, which is calculated by using the step response calculation formula for the RC circuit. In the graph of FIG. 5, the constant of the resistor 6 that can be mounted at the resistor mounting position MPI is the resistance constant Rs (2 k Ω) or Rw (10 k Ω). In FIG. 5, the potential changes in these two cases are illustrated. The potential Vc of the signal line L is expressed by the following equation (4) in relation with the time t (seconds) from the start.

$$Vc(t) = 3.3 * e^{\left(-\frac{t}{T}\right)} \quad (4)$$

Here, the values of "e" and "T" are the same as in the explanation for FIG. 4.

As illustrated in the graph of FIG. 5, it can be seen that, in the case of the resistance constant Rs (2 k Ω), at the latest the time of 145 μs, the potential Vc of the signal line L goes below the threshold Vil (0.8 V), which means that the IO buffer 12 reads "0" from the signal line L at the latest the time of 145 μs. On the other hand, it can be seen that, in the case of the resistance constant Rw (10 k Ω), the potential Vc of the signal line L remains above the threshold Vil (0.8 V) up to the time of 250 μs at the earliest, which means that the IO buffer 12 reads "1" from the signal line L up to the time of 250 μs at the earliest. For example, 200 μs after the IO buffer 12 starts in the high impedance state ("oe=0"), the IO buffer 12 reads "0" from signal line L in the case of the resistance constant Rs (2 k Ω), and reads "1" from the signal line L in the case of the resistance constant Rw (10 k Ω).

(1-5. Timing Charts)

Figure 6:
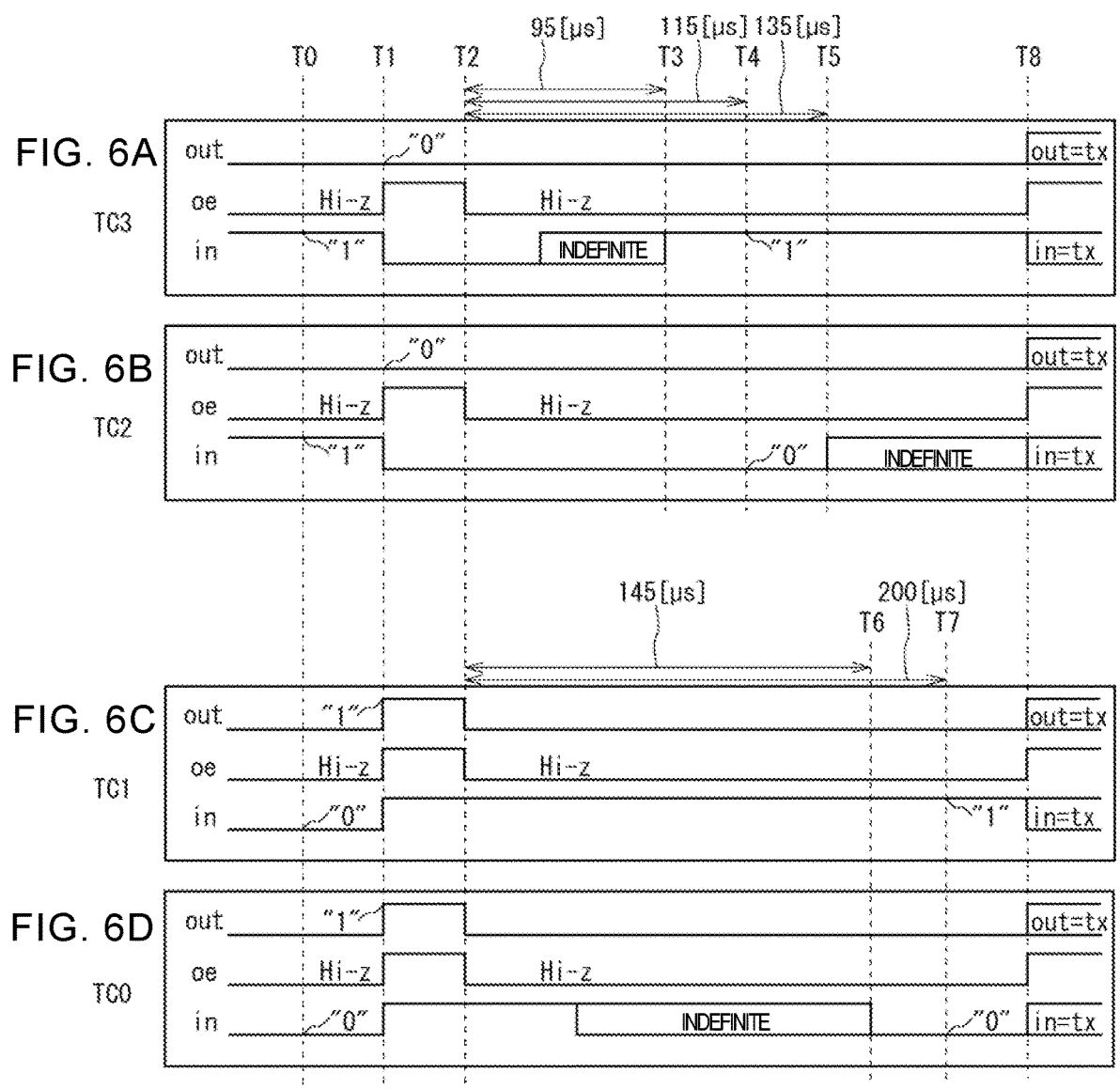

FIGS. 6A to 6D each illustrate a timing chart of the signals (the OUT signal, the OE signal, and the IN signal) between the IO buffer control unit 14 and the 10 buffer 12 for each combination of the resistor mounting position MP and the resistor constant R. FIG. 6A illustrates the timing chart TC3 in the case of the set value 3 illustrated in FIG. 3A, FIG. 6B illustrates the timing chart TC2 in the case of the set value 2 illustrated in FIG. 3B, FIG. 6C illustrates the timing chart TC1 in the case of the set value 1 illustrated in FIG. 3C, and FIG. 6D illustrates the timing chart TC0 in the case of the set value 0 illustrated in FIG. 3D.

Here, the IN signal illustrated in FIGS. 6A to 6D is expressed by "0" or "1", which is obtained by the result of reading the potential Vc of the signal line L illustrated in FIGS. 4 and 5 by the IO buffer 12 (LVTTL buffer). The IO buffer 12 determines that, in the state of Vc>Vih (2.0 V), the IN signal is "1" (hereafter may be referred to as "in =1"). The IO buffer 12 determines that, in the state of Vil (0.8 V)<Vc<Vih (2.0 V), the IN signal is indefinite or uncertain (it is not certain whether it is "0" or "1"). To the contrary, the IO buffer 12 determines that, in the state of Vc>Vil (0.8 V), the IN signal is "0" (hereafter may be referred to as "in =0").

(1-6. Set Value Reading Process)

Figure 7:
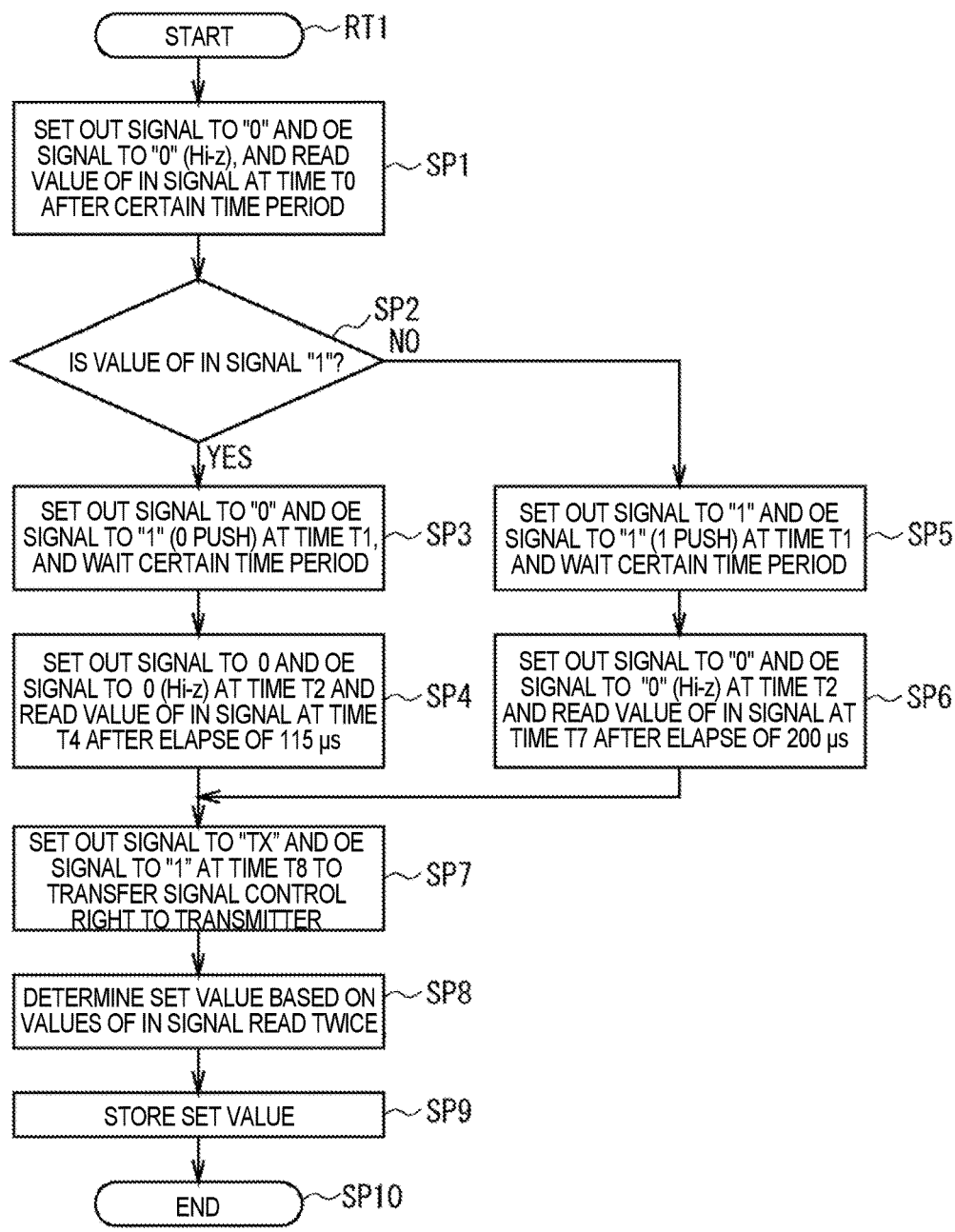
FIG. 7 is a flowchart illustrating a set value reading processing procedure according to a first embodiment.

The IO buffer control unit 14 reads the set value at the power-on of the semiconductor integrated circuit 3 before the firmware is started up, which is called a set value reading process. Next, with reference to the timing charts in FIGS. 6A to 6D and the flowchart in FIG. 7, a set value reading processing procedure RT1, which is a specific procedure of the set value reading process, will be described for each of four combinations (four patterns) of the resistor mounting position MP and the resistance constant R. The IO buffer control unit 14 initiates the set value reading processing procedure RT1, to proceed to step SP1.

(1-6-1. Set Value 3)

First, the case where the resistor 6s having the resistor constant Rs is mounted to the resistor mounting position MPu and no resistor is mounted to the resistor mounting position MPl as illustrated in FIG. 3A, which is the case of the set value being 3, will be explained with reference to the timing chart TC3 illustrated in FIG. 6A.

In step SP1 after the power is turned on, the IO buffer control unit 14 sets the IO buffer 12 to the high impedance state by setting the output signals to "out=0" and "oe=0", reads, at time T0 after a lapse of a certain time period, the value of the IN signal as a first signal at a first time point, and proceeds to step SP2. Note that, in practice, at time T0 when the reset signal of the semiconductor integrated circuit 3 is turned off from on after the semiconductor integrated circuit 3 is turned on, the 10 buffer control unit 14 reads the value of the IN signal. Here, since the resistor 6s is mounted at the resistor mounting position MPu and the signal line L is pulled up at 3.3 V, the IN signal is "1". In step SP2, the IO buffer control unit 14 determines whether or not the value of the IN signal read in step SP1 is "1". Here, the value of the IN signal read in step SP1 is "1", and thus the IO buffer control unit 14 obtains a positive result in step SP2 and proceeds to step SP3.

In step SP3, the IO buffer control unit 14 sets at time T1 the output signals to "out=0" and "oe=1" so as to cause the IO buffer 12 to output "0" as a second signal at a second time point, and after an elapse of a certain time period, proceeds to step SP4. In this step SP3, the IO buffer control unit 14 outputs the OUT signal whose value has a logic level different from the value of the IN signal read in step SP1.

In step SP4, the IO buffer control unit 14 sets at time T2 the output signals to "out=0" and "oe=0" again so as to set the IO buffer 12 to the high impedance state, reads, at time T4 after an elapse of 115 μs, the value of the IN signal as a third signal at a third time point, and proceeds to step SP7. Note that since the clock frequency of the OSC4 is 10 MHz (the clock cycle 0.1 μs), the IO buffer control unit 14 counts the progress of 115 μs by waiting 1150 clocks. Here, the resistance constant is Rs. In this case, after 95 μs elapse from time T2 (t=0 μs in FIG. 4), the potential of the signal line L in the case of the resistance constant Rs becomes Vc>Vih (2.0 V), that is, the IN signal becomes 1 ("in =1"). That is, the IN signal is 1 ("in =1") even at the time T4 when 95 μs or more have passed from the time T2.

In step SP7, the IO buffer control unit 14 sets the output signals to "out=tx" and "oe=1" at time T8 so as to transfer the signal control right of the IO buffer 12 to the transmitter 16, and proceeds to step SP8.

In step SP8, the IO buffer control unit 14 determines the current set value based on the value of the IN signal read in step SP1 and the value of the IN signal read in step SP4, and proceeds to step SP9. Specifically, the IO buffer control unit 14 sets the value of the IN signal read in step SP1 to the most significant bit of the two bits in the binary number representation in the set value, and sets the value of the IN signal read in step SP4 to the least significant bit of the two bits in the binary number representation in the set value. In this case, since the value of the IN signal read in step SP1 is "1", the most significant bit of the set value is "1", and since the value of the IN signal read in step SP4 is "1", the least significant bit of the set value is "1". Accordingly, the IO buffer control unit 14 determines that the current set value is "11b" in the binary number representation, and thus determines that the set value is 3 based on this "11 b".

In step SP9, the IO buffer control unit 14 stores the determined set value in the memory 18 and proceeds to step SP10 to complete the set value reading processing procedure RT1. In this way, the IO buffer control unit 14 reads the value of the IN signal twice, and treats the value of the IN signal read in the first time as the most significant bit and treats the value of the IN signal read in the second time as the least significant bit in the binary number representation in the set value, so as to determine the set value.

(1-6-2. Set Value 2)

Next, the case where the resistor 6w having the resistor constant Rw is mounted to the resistor mounting position MPu and no resistor is mounted to the resistor mounting position MPl as illustrated in FIG. 3B, which is the case of the set value being 2, will be explained with reference to the timing chart TC2 illustrated in FIG. 6B.

In step SP1 after the power is turned on, the IO buffer control unit 14 sets the IO buffer 12 to the high impedance state by setting the output signals to "out=0" and "oe=0", reads out the value of the IN signal at time T0 after an elapse of a certain time period, and proceeds to step SP2. Here, since the resistor 6w is mounted at the resistor mounting position MPu and the signal line L is pulled up to 3.3 V, the IN signal is "1". In step SP2, the IO buffer control unit 14 determines whether or not the value of the IN signal read in step SP1 is "1". Here, the value of the IN signal read in step SP1 is "1", and thus the IO buffer control unit 14 obtains a positive result in step SP2 and proceeds to step SP3.

In step SP3, the IO buffer control unit 14 sets at time T1 the output signals to "out=0" and "oe=1" so as to cause the IO buffer 12 to output "0", and after a certain period of time, proceeds to step SP4.

In step SP4, the IO buffer control unit 14 sets at time T2 the output signals to "out=0" and "oe=0" again so as to set the IO buffer 12 to the high impedance state, reads, at time T4 after 115 µs elapse from time T2, the value of the IN signal, and proceeds to step SP7. Here, the resistance constant is Rw. In this case, from time T2 (t=0 µs in FIG. 4) until the time (T5) when 135 µs have elapsed from time T2, the potential Vc of the signal line L in the case of the resistance constant Rw is smaller than Vil (0.8 V) (Vc<Vil (0.8 V)), and thus the IN signal is maintained to 0 ("in =0"). Thus, the IN signal is 0 ("in =0"), at time T4, which is before 135 µs have elapsed from time T2.

In step SP7, the IO buffer control unit 14 sets the output signals to "out=tx" and "oe=1" at time T8 so as to transfer the signal control right of the IO buffer 12 to the transmitter 16, and proceeds to step SP8.

In step SP8, the IO buffer control unit 14 determines the current set value based on the value of the IN signal read in step SP1 and the value of the IN signal read in step SP4, and proceeds to step SP9. In this case, since the value of the IN signal read in step SP1 is "1", the most significant bit of the set value is determined to be "1", and since the value of the IN signal read in step SP4 is "0", the least significant bit of the set value is determined to be "0". Accordingly, the IO buffer control unit 14 determines that the current set value is "10b" in the binary number representation, and thus determines that the set value is 2 based on this "10b".

In step SP9, the IO buffer control unit 14 stores the determined set value in the memory 18 and proceeds to step SP10 to complete the set value reading processing procedure RT1.

(1-6-3. Set Value 1)

Next, the case where the resistor 6w having the resistor constant Rw is mounted to the resistor mounting position MPl and no resistor is mounted to the resistor mounting position MPu as illustrated in FIG. 3C, which is the case of the set value being 1, will be explained with reference to the timing chart TC1 illustrated in FIG. 6C.

In step SP1 after the power is turned on, the IO buffer control unit 14 sets the IO buffer 12 to the high impedance state by setting the output signals to "out=0" and "oe=0", reads out the value of the IN signal at time T0 after a certain time period, and proceeds to step SP2. Here, since the resistor 6w is mounted at the resistor mounting position MPl and the signal line L is pulled down to 0 V, the IN signal read in step SP1 is "0". In step SP2, the IO buffer control unit 14 determines whether or not the value of the IN signal read in step SP1 is "1". Here, the value of the IN signal read in step SP1 is "0", so the IO buffer control unit 14 obtains a negative result in step SP2 and proceeds to step SP5.

In step SP5, the IO buffer control unit 14 sets at time T1 the output signals to "out=1" and "oe=1" so as to cause the IO buffer 12 to output "1", and after a certain time period, proceeds to step SP6. In this step SP5, the IO buffer control unit 14 outputs the OUT signal whose value has a logic level different from the value of the IN signal read in step SP1.

In step SP6, the IO buffer control unit 14 sets at time T2 the output signals to "out=0" and "oe=0" again as so to set the IO buffer 12 to the high impedance state, reads, at time T7 after 200 µs elapse from time T2, the value of the IN signal as a third signal at a third time point, and proceeds to step SP7. Note that since the clock frequency of the OSC4 is 10 MHz (the clock cycle 0.1 µs), the IO buffer control unit 14 counts the progress of 200 µs by waiting 2000 clocks. Here, the resistance constant is Rw. In this case, from time T2 (t=0 µs in FIG. 5) until the time when 250 µs have elapsed from time T2, the potential Vc of the signal line L in the case of the resistance constant Rw is greater than Vih (2.0 V) (Vc>Vih (2.0 V)), and thus the IN signal is maintained at 1 ("in =1"). Therefore, the IN signal is 1 ("in =1") at time T7, which is before 250 µs have elapsed from time T2.

In step SP7, the IO buffer control unit 14 sets the output signals to "out=tx" and "oe=1" at time T8 so as to transfer the signal control right of the IO buffer 12 to the transmitter 16, and proceeds to step SP8.

In step SP8, the IO buffer control unit 14 determines the current set value based on the value of the IN signal read in step SP1 and the value of the IN signal read in step SP6, and proceeds to step SP9. In this case, since the value of the IN signal read in step SP1 is "0", the most significant bit of the set value is determined to be "0", and since the value of the IN signal read in step SP6 is "1", the least significant bit of the set value is determined to be "1". Accordingly, the IO buffer control unit 14 determines that the current set value is "01b" in the binary number representation, and thus determines that the set value is 1 based on this "01 b".

In step SP9, the IO buffer control unit 14 stores the determined set value in the memory 18 and proceeds to step SP10 to complete the set value reading processing procedure RT1.

(1-6-4. Set Value 0)

Next, the case where the resistor 6s having the resistor constant Rs is mounted to the resistor mounting position MPl and no resistor is mounted to the resistor mounting position MPu as illustrated in FIG. 3D, which is the case of the set value being 0, will be explained with reference to the timing chart TC0 illustrated in FIG. 6D.

In step SP1 after the power is turned on, the IO buffer control unit 14 sets the IO buffer 12 to the high impedance state by setting the output signals to "out=0" and "oe=0", reads out the value of the IN signal at time T0 after a certain time period, and proceeds to step SP2. Here, since the resistor 6s is mounted at the resistor mounting position MPl and the signal line L is pulled down to 0 V, the value of the IN signal read in step SP1 is "0". In step SP2, the IO buffer control unit 14 determines whether or not the value of the IN signal read in step SP1 is "1". Here, the value of the IN signal read in step SP1 is "0", so the IO buffer control unit 14 obtains a negative result in step SP2 and proceeds to step SP5.

In step SP5, the IO buffer control unit 14 sets at time T1 the output signals to "out=1" and "oe=1" so as to cause the IO buffer 12 to output "1", and after a certain time period, proceeds to step SP6.

In step SP6, the IO buffer control unit 14 sets at time T2 the output signals to "out=0" and "oe=0" again so as to set the IO buffer 12 to the high impedance state, reads, at time T7 after 200 µs elapse from time T2, the value of the IN signal, and proceeds to step SP7. Here, the resistance constant is Rs. In this case, after 145 µs elapse from time T2 (t=0 µs in FIG. 5), the potential Vc of the signal line L in the case of the resistance constant Rs becomes larger than Vih (Vc>Vih (0.8 V)), that is, the IN signal becomes 0 ("in =0"). That is, even at the time T7 when 145 µs or more have passed from the time T2, the IN signal is 0 ("in =0").

In step SP7, the IO buffer control unit 14 sets the output signals to "out=tx" and "oe=1" at time T8 so as to transfer the signal control right of the IO buffer 12 to the transmitter 16, and proceeds to step SP8.

In step SP8, the IO buffer control unit 14 determines the current set value based on the value of the IN signal read in step SP1 and the value of the IN signal read in step SP6, and proceeds to step SP9. In this case, since the value of the IN signal read in step SP1 is "0", the most significant bit of the set value is determined to be "0", and since the value of the IN signal read in step SP6 is "0", the least significant bit of the set value is determined to be "0". Accordingly, the IO buffer control unit 14 determines that the current set value is "00b" in the binary number representation, and thus determines that the set value is 0 based on this "01 b".

In step SP9, the IO buffer control unit 14 stores the determined set value in the memory 18 and proceeds to step SP10 to complete the set value reading processing procedure RT1.

(1-6. Effects)

In the above configuration, the circuit board 2 is configured such that, depending on the set value to be used in the initial operation of the semiconductor integrated circuit 3, one of the resistors 6s and 6w whose resistance values are different from each other, is selectively mounted on one of the resistor mounting positions MPu and MPl. That is, the circuit board 2 is configured such that one of the pull-up resistor and the pull-down resistor whose resistance values are different from each other can be selectively mounted thereon.

Further, the semiconductor integrated circuit 3 first reads the state of the terminal 11 in the high impedance state so as to obtain one bit of the set value, and next changes the state of the terminal 11 to 0 or 1, which has the logic level different from the state read earlier, returns the state of the terminal to the high impedance state, and reads, after a certain time period, the state of the terminal 11 again, so as to obtain another bit of the set value. Therefore, the semiconductor integrated circuit 3 can take in the 2-bit set value (can select one of four different set values) at the terminal 11, which is the single terminal.

In a conventional art, a set value of 1 bit per terminal is read in a high impedance state by using a pull-up resistor or a pull-down resistor having one resistance value. However, since the semiconductor integrated circuit 3 according to a first embodiment is configured as described above, even when the number of terminals that can be used to capture the information of the set value is the same as that of the conventional art, the semiconductor integrated circuit 3 can capture twice the number of the set values than the conventional art.

Here, it is also conceivable that, as a comparative example, a circuit board 2 may be configured to omit the resistor(s) and have a serial interface IC connected to the signal line L such that the semiconductor integrated circuit 3 can receive a binary set value as the IN signal from the serial interface IC to obtain the set value. However, in such a comparative example, it is necessary to add the serial interface IC, and thus the configuration of the circuit board 2 becomes more complex and more costly.

To the contrary, the circuit board 2 according to a first embodiment is configured to have the resistor mounting positions MPu and MPl such that one of the resistors 6s and 6w having different resistance values can be mounted to either one of the resistor mounting positions MPu and MPl. This can simplify the configuration and lowers the cost of the circuit board 2.

According to the configuration described above, the semiconductor integrated circuit 3 serving as an integrated circuit includes the terminal 11 that is to be connected to the power supply Vcc having the predetermined potential and the ground potential GND and is to be connected to one of the resistors 6 (impedance elements) having different resistance values as characteristics of the impedance elements), wherein the semiconductor integrated circuit 3 is configured to detect, upon changing the potential of one of the electrodes of the resistor 6 that is selectively connected to the terminal 11, a change in the electrical characteristics of the terminal 11 based on the characteristics of the resistor 6, to determine (select) one of a plurality of setting conditions for the operation of the semiconductor integrated circuit 3, and store the determined one setting condition in the memory 18, so as to operate the semiconductor integrated circuit 3 based on the stored setting condition.

This allows the semiconductor integrated circuit 3 to determine one of the plurality of setting conditions for operating the semiconductor integrated circuit 3 by detecting characteristics of one of the resistors 6, having different electrical characteristics from each other, that is selectively mounted to the same resistor mounting position MP.

(2. Second Embodiment)

(2-1. Printer Configuration)

Figure 8:
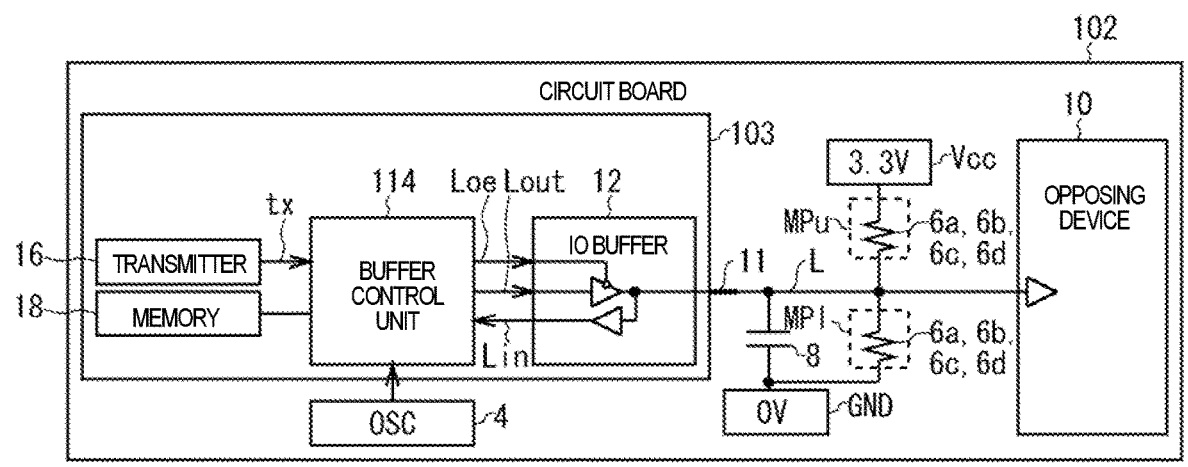
FIG. 8 is a block diagram illustrating a view of a configuration of a circuit board according to a second embodiment.

As illustrated in FIG. 8, where the same reference numerals are designated to the components corresponding to those in FIGS. 1 and 2, a printer 101 according to a second embodiment is different from the printer 1 according to a first embodiment in that a circuit board 102 is provided in place of the circuit board 2, but the other configurations are the same as in a first embodiment.

(2-2. Configuration of Circuit Board)

As illustrated in FIG. 8, the circuit board 102 according to a second embodiment is different from the circuit board 2 according to a first embodiment in that a semiconductor integrated circuit 103 is provided in place of the semiconductor integrated circuit 3 to the circuit board 102 and resistors 6a, 6b, 6c, and 6d instead of the resistors 6s and 6w can be mounted to the circuit board 102, but the other configurations are the same as or similar to those of a first embodiment. The semiconductor integrated circuit 103 according to a second embodiment is different from the semiconductor integrated circuit 3 according to a first embodiment in that an IO buffer control unit 114 in place of the IO buffer control unit 14 is provided, but the other configurations are the same as or similar to those of a first embodiment.

The memory 18 stores in advance a set value replacement correspondence table TB1 illustrated in FIG. 16 (described later). The memory 18 is configured to store therein the value of the "in" signal received from the IO buffer control unit 114. The IO buffer control unit 14 determines the set value (i.e., set value 7, set value 6, set value 5, set value 4, set value 3, set value 2, set value 1, and set value 0) for initial operation of the semiconductor integrated circuit 3, based on a plurality of values of the "in" signal stored in the memory 18 with reference to the set value replacement correspondence table TB1 (see FIG. 16). The memory 18 is configured to store therein the set value that is determined by the IO buffer control unit 14.

Figure 9:
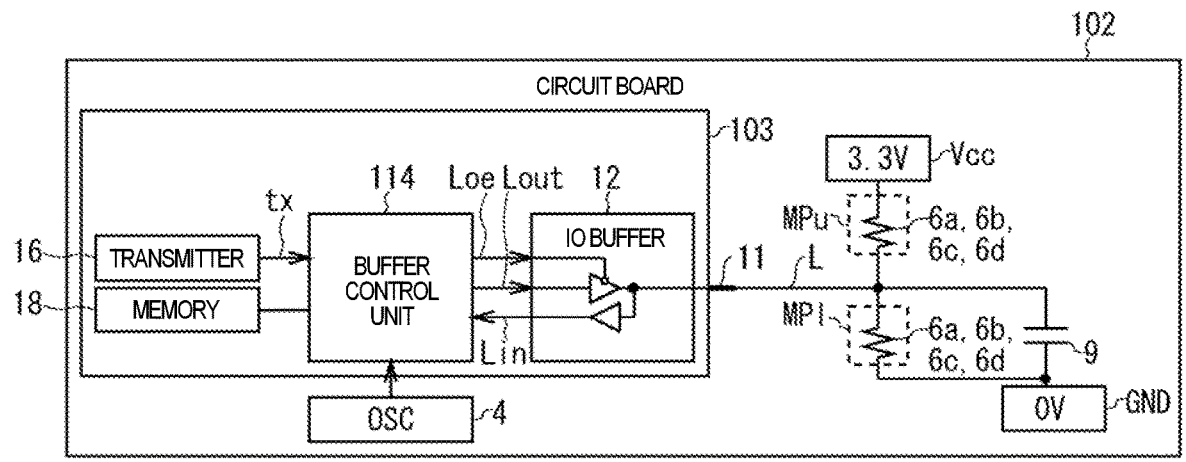
FIG. 9 is a block diagram illustrating a configuration of an equivalent circuit of the circuit board according to a second embodiment, which is obtained by replacing a capacitor and an opposing device of the circuit board with a capacitor having an equivalent load capacitance thereof.

FIG. 9 illustrates an equivalent circuit of the circuit board 102 according to a second embodiment, which is obtained by replacing the capacitor 8 and the opposing device 10 of the circuit board with the capacitor 9 having the load capacitance equivalent thereof. The capacitance value C of the capacitor 9 is 50 pF (C=50 pF). The capacitor 8 may contain a parasitic capacitance between the signal line L and 0 V.

The resistors 6 (6a, 6b, 6c, and 6d) are resistor elements such as chip resistors. Only one of the resistors 6a, 6b, 6c, and 6d is selectively mounted on either one of the resistor mounting positions MPu and MPl. In other words, the resistors 6 will not be mounted at both of the resistor mounting positions MPu and MPl. In the following, the resistors 6a, 6b, 6c and 6d may be referred to as resistors 6. The resistance constants Ra, Rb, Rc and Rd of the resistors 6a, 6b, 6c and 6d are, for example, 1 k Ω, 5.1 k Ω, 20 k Ω, and 100 k Ω, respectively.

(2-3. Combinations of Resistor Mounting Position and Resistor Constant)

FIGS. 10A, 10B, 10C, 10D, 10E, 10F, 10G and 10H illustrate combinations of the resistance constant R (Ra, Rb, Rc, Rd) of the resistor 6 and the resistor mounting position MP (MPu, MPl) in which the resistor 6 can be mounted on the circuit board 102. The semiconductor integrated circuit 103 is configured to detect (read) from the signal line L one of eight different set values of 7, 6, 5, 4, 3, 2, 1, and 0 according to one of eight different combinations (eight different patterns) of the resistor mounting position MP and the resistor constant R. In each of FIGS. 10A to 10H, the resistor mounting position MP and the resistance constant R and the set value read by the semiconductor integrated circuit 103 are as follows.

Figure 10A:
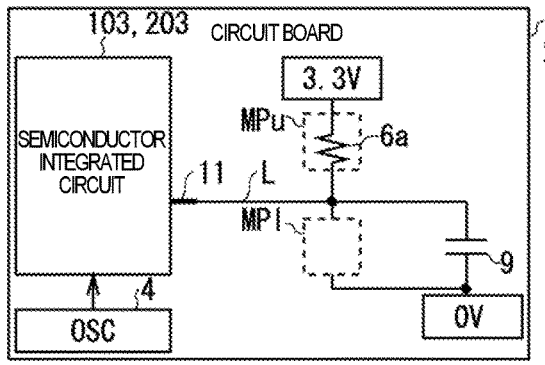

FIG. 10A: the resistor mounting position MPu, the resistance constant Ra, the set value 7

Figure 10B:
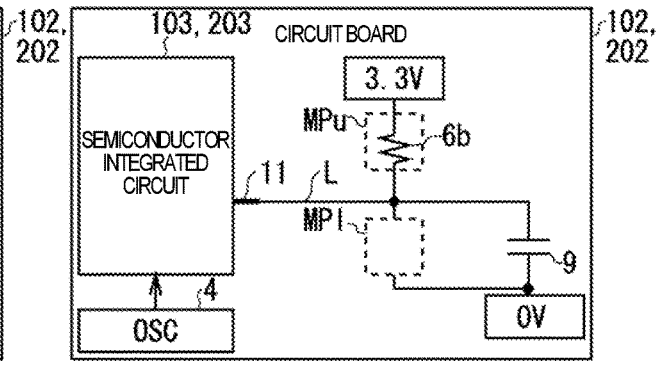

FIG. 10B: the resistor mounting position MPu, the resistance constant Rb, and the set value 6

Figure 10C:
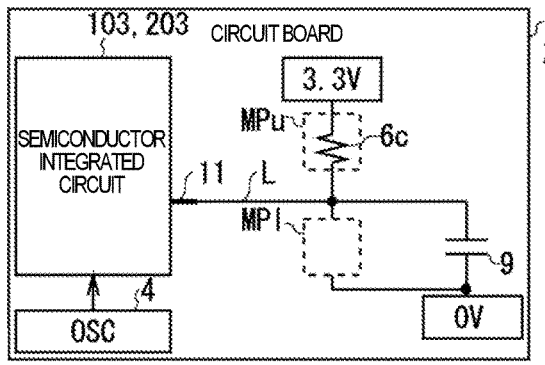

FIG. 10C: the resistor mounting position MPu, the resistance constant Rc, and the set value 5

Figure 10D:
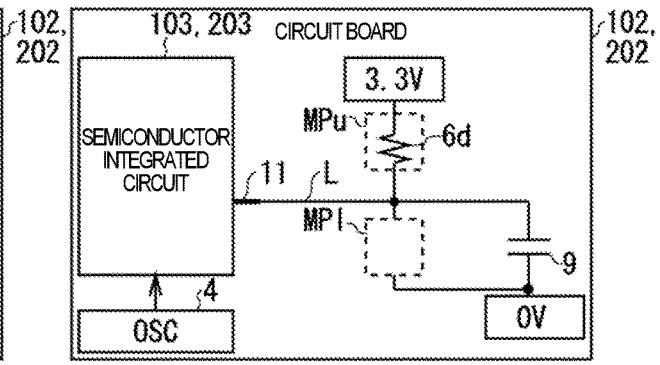

FIG. 10D: the resistor mounting position MPu, the resistance constant Rd, and the set value 4

Figure 10E:
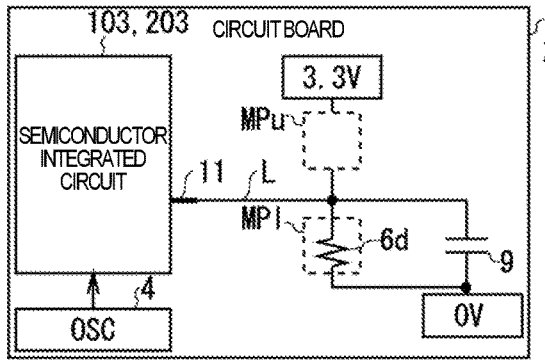

FIG. 10E: the resistor mounting position MPl, the resistance constant Rd, and the set value 3

Figure 10F:
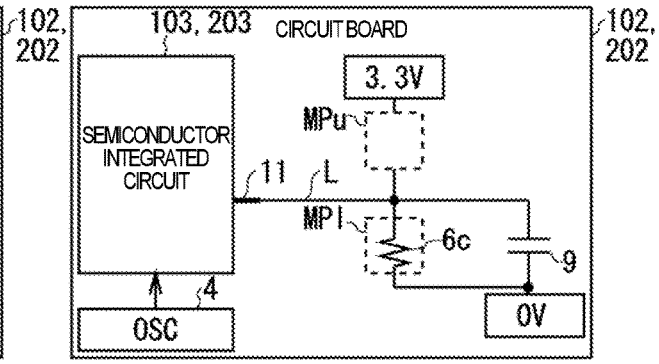

FIG. 10F: the resistor mounting position MPl, the resistance constant Rc, and the set value 2

Figure 10G:
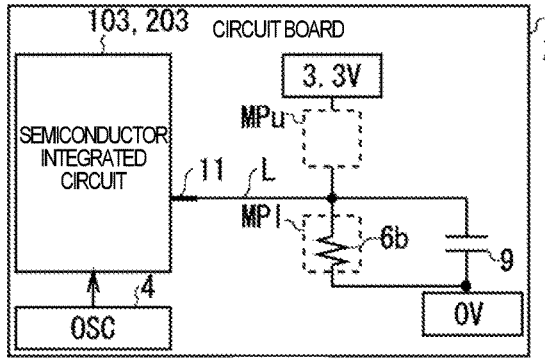

FIG. 10G: the resistor mounting position MPl, the resistance constant Rb, and the set value 1

Figure 10H:
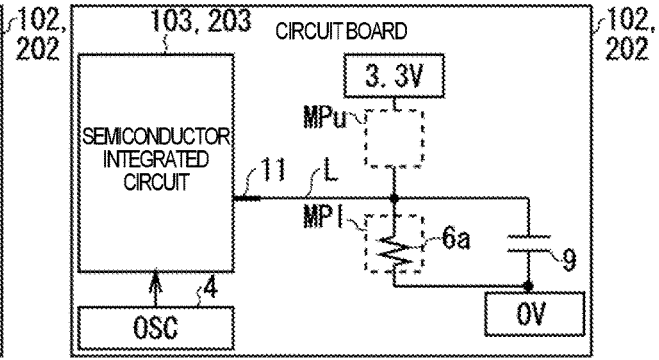

FIG. 10H: the resistor mounting position MPl, the resistance constant Ra, and the set value 0

That is, for example, in a case illustrated in FIG. 20A, in which the resistor 6a having the resistor constant Ra is mounted at the resistor mounting position MPu and no resistor is mounted at the resistor mounting position MPl, the semiconductor integrated circuit 103 reads the set value of 7.

(2-4. Relationship Between Elapsed Time and Potential of Signal Line)

(2-4-1. Case where the Resistor 6a, 6b, 6c or 6d is Mounted at the Resistor Mounting Position MPu)

Figure 11:
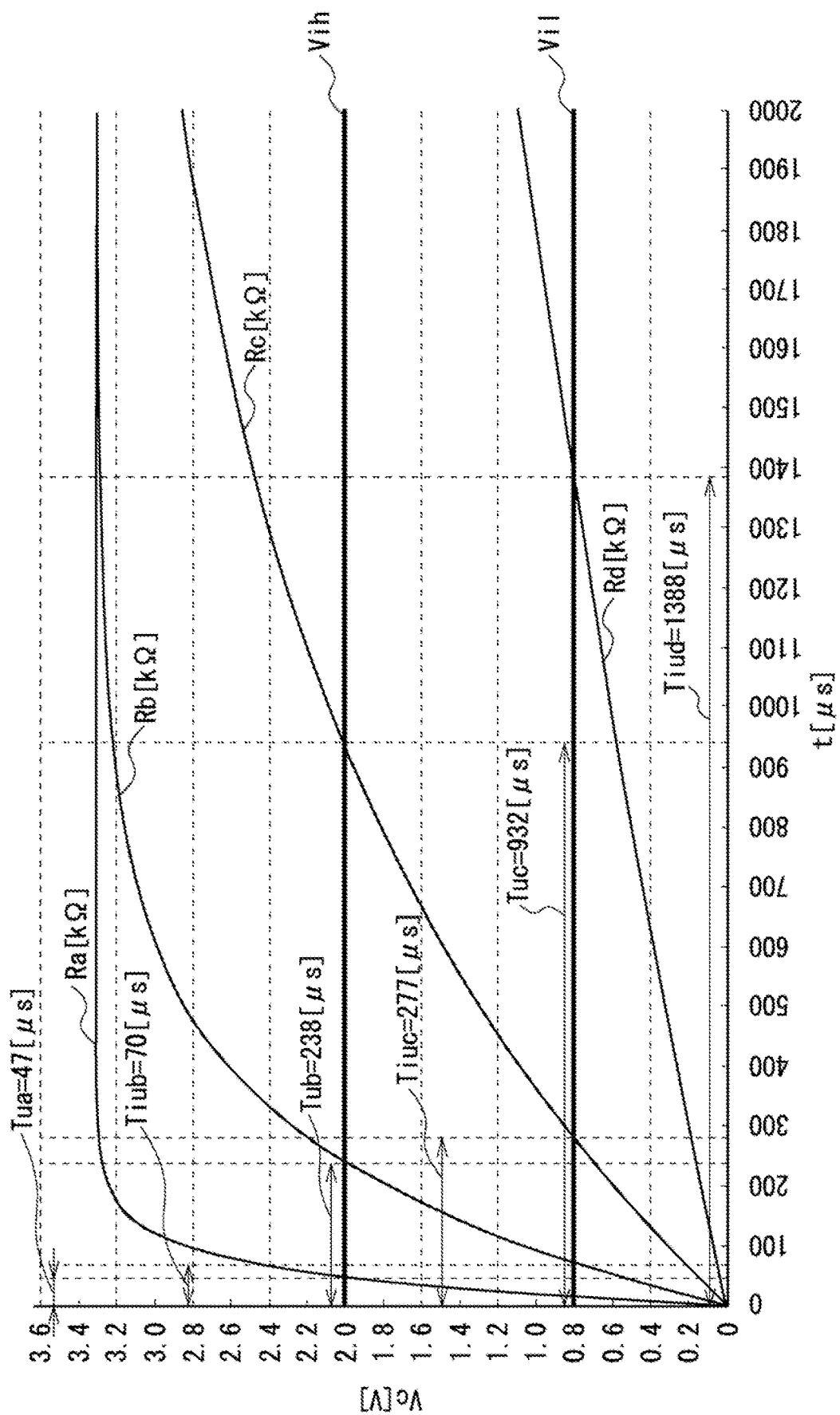
FIG. 11 is a graph illustrating a relationship between a potential Vc of a signal line L and an elapsed time in a case where a resistor Ra, Rb, Rc, or Rd is mounted at a resistor mounting position MPI according to second and third embodiments.

FIG. 11 illustrates the graph illustrating a change in the potential of the potential Vc of the signal line L, starting from L=0 V in the state where the IO buffer 12 is in the high impedance state (in the setting "oe=0") in a case where the resistor 6a, 6b, 6c, or 6d is mounted to the resistor mounting position MPu, which is calculated by using the step response calculation formula for the RC circuit. In this graph illustrated in FIG. 11, the constant of the resistor 6 that can be mounted at the resistor mounting position MPu is one of the resistance constants Ra (1 k Ω), Rb (5.1 kΩ), Rc (20 k Ω), and Rd (100 k Ω). In FIG. 11, the potential changes in these four cases are illustrated. The potential Vc of the signal line L is expressed by the equation (1) described above in relation with the time t (seconds) from the start.

The value of "T" is calculated by the following Equation (5) when the resistance constant is Ra (1 k Ω), is calculated by the following Equation (6) when the resistance constant is Rb (5.1 k Ω), is calculated by the following Equation (7) when the resistance constant is Rc (20 k Ω), and is calculated by the following Equation (8) when the resistance constant is Rd (100 k Ω).

$$\tau = C*Ra = 50*10^{-9}*1*10^3 = 50*10^{-6} = [\mu s] \quad (5)$$

$$\tau = C*Rb = 50*10^{-9}*5.1*10^3 = 255*10^{-6} = 255[\mu s] \quad (6)$$

$$\tau = C*Rc = 50*10^{-9}*20*10^3 = 1000*10^{-6} = 1000[\mu s] \quad (7)$$

$$\tau = C*Rd = 50*10^{-9}*100*10^3 = 5000\ ^{-6} = 5000[\mu s] \quad (8)$$

As illustrated in the graph of FIG. 11, it can be seen that, in the case of the resistance constant Ra (1 k Ω), at the latest the time of 47 μs, the potential Vc of the signal line L exceeds the threshold Vih (2 V), which means that the IO buffer 12 reads "1" from the signal line L at the latest the time of 47 μs. Also, it can be seen that, in the case of the resistance constant Rb (5.1 k Ω), the potential Vc of the signal line L does not exceed the threshold Vil (0.8 V) until the time of 70 μs at the earliest, which means that the IO buffer 12 reads "0" from the signal line L until the time of 70 μs at the earliest. For example, 60 μs after the IO buffer 12 starts in the high impedance state ("oe=0"), the IO buffer 12 reads "1" from signal line L in the case of the resistance constant Ra (1 k Ω), and reads "0" from the signal line L in the case of the resistance constant Rb (5.1 k Ω).

(2-4-2. Case where the Resistor 6a, 6b, 6c or 6d is Mounted at the Resistor Mounting Position MPl)

Figure 12:
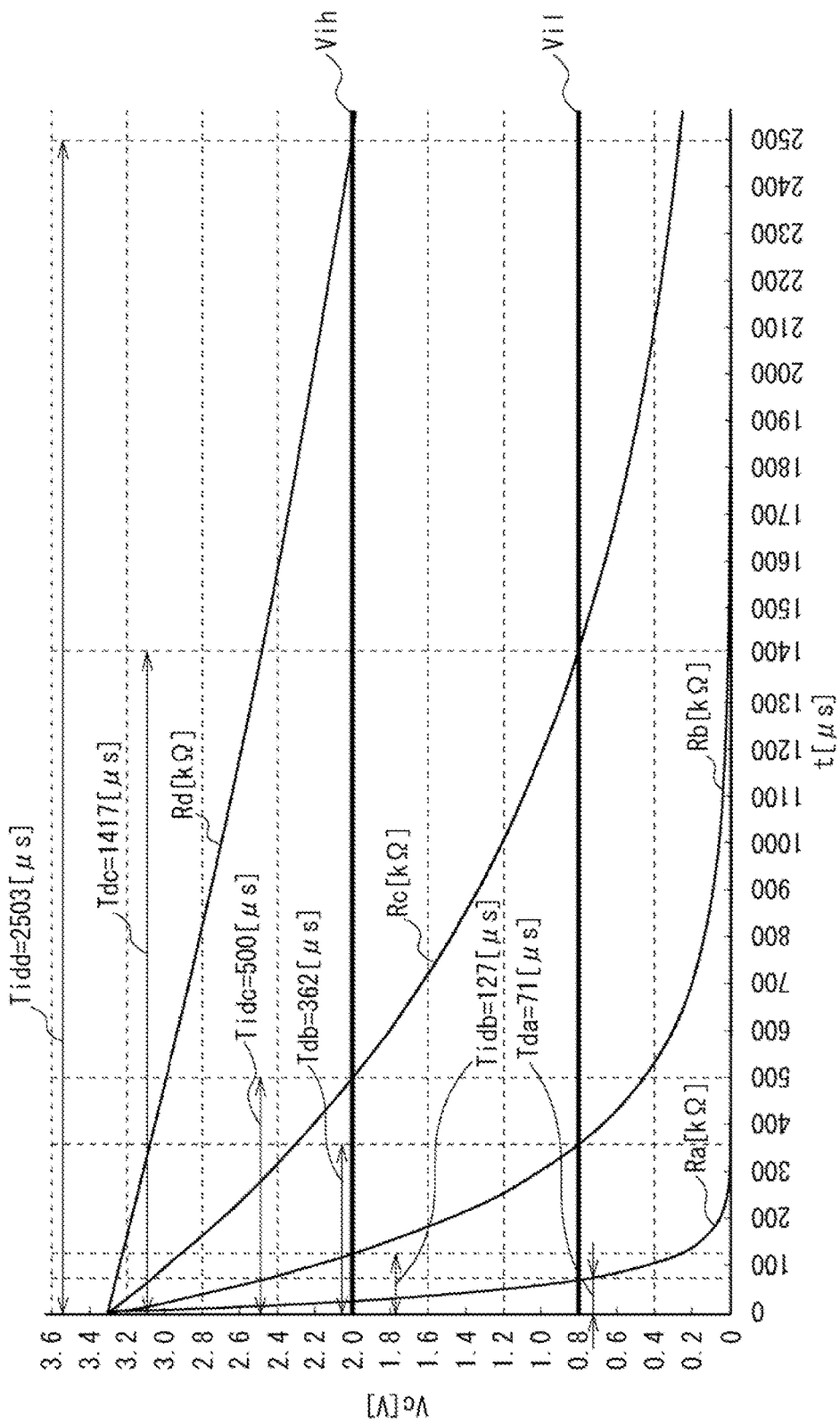
FIG. 12 is a graph illustrating a relationship between the potential Vc of the signal line L and the elapsed time in a case where the resistor Ra, Rb, Rc, or Rd is mounted at a resistor mounting position MPI according to second and third embodiments.

FIG. 12 illustrates the graph illustrating a change in the potential of the potential Vc of the signal line L, starting from L=3.3 V in the state where the IO buffer 12 is in the high impedance state (in the setting "oe=0") in a case where the resistor 6a, 6b, 6c, or 6d is mounted to the resistor mounting position MPl, which is calculated by using the step response calculation formula for the RC circuit. In this graph illustrated in FIG. 12, the constant of the resistor 6 that can be mounted at the resistor mounting position MPl is one of the resistance constants Ra (1 k Ω), Rb (5.1 kΩ), Rc (20 k Ω), and Rd (100 k Ω). In FIG. 12, the potential changes in these four cases are illustrated. The potential Vc of the signal line L is expressed by the equation (4) described above in relation with the time t (seconds) from the start.

Here, "e" and "T" are the same as in FIG. 11.

As illustrated in the graph of FIG. 12, it can be seen that, in the case of the resistance constant Ra (1 k Ω), the potential Vc of the signal line L goes below the threshold Vil (0.8 V) at the latest the time of 71 μs, which means that the IO buffer 12 reads "0" from the signal line L at the latest the time of 71 μs. Also, it can be seen that, in the case of the resistance constant Rb (5.1 k Ω), the potential Vc of the signal line L remains above the threshold Vih (2 V) up to the time of 127 μs at the earliest, which means that the IO buffer 12 reads "1" from the signal line L until the time of 127 μs at the earliest. For example, 100 μs after the IO buffer 12 starts in the high impedance state ("oe=0"), the IO buffer 12 reads "0" from signal line L in the case of the resistance constant Ra (1 k Ω), and reads "1" from the signal line L in the case of the resistance constant Rb (5.1 k Ω).

(2-5. Timing Charts)

FIGS. 13A to 13D and 14A to 14D each illustrate a timing chart of the signals (the OUT signal, the OE signal, and the IN signal) between the IO buffer control unit 14 and the IO buffer 12 for each combination of the resistor mounting position MP and the resistor constant R. FIG. 13A illustrates the timing chart TC7 in the case of the set value being 7 illustrated in FIG. 10A, FIG. 13B illustrates the timing chart TC6 in the case of the set value being 6 illustrated in FIG. 10B, FIG. 13C illustrates the timing chart TC5 in the case of the set value being 5 illustrated in FIG. 10C, FIG. 13D illustrates the timing chart TC4 in the case of the set value being 4 illustrated in FIG. 10D, FIG. 14A illustrates the timing chart TC3 in the case of the set value being 3 illustrated in FIG. 10E, FIG. 14B illustrates the timing chart TC2 in the case of the set value being 2 illustrated in FIG. 10F, FIG. 14C illustrates the timing chart TC1 in the case of the set value being 1 illustrated in FIG. 10G, and FIG. 14D illustrates the timing chart TC0 in the case of the set value being 0 illustrated in FIG. 10H.

Here, as in a first embodiment described above, the IN signal is "0" or "1" obtained by the result of reading the potential Vc of the signal line L illustrated in FIGS. 11 and 12 by the IO buffer 12 (the LVTTL buffer). The IO buffer 12 determines that, in the state of Vc>Vih (2.0 V), the IN signal is "1" (hereafter may be referred to as "in =1"). The IO buffer 12 determines that, in the state of Vil (0.8 V)<Vc<Vih (2.0 V), the IN signal is indefinite or uncertain (it is not certain whether it is "0" or "1"). To the contrary, the IO buffer 12 determines that, in the condition of Vc>Vil (0.8 V), the IN signal is "0" (hereafter may be referred to as "in =0").

Figure 13:
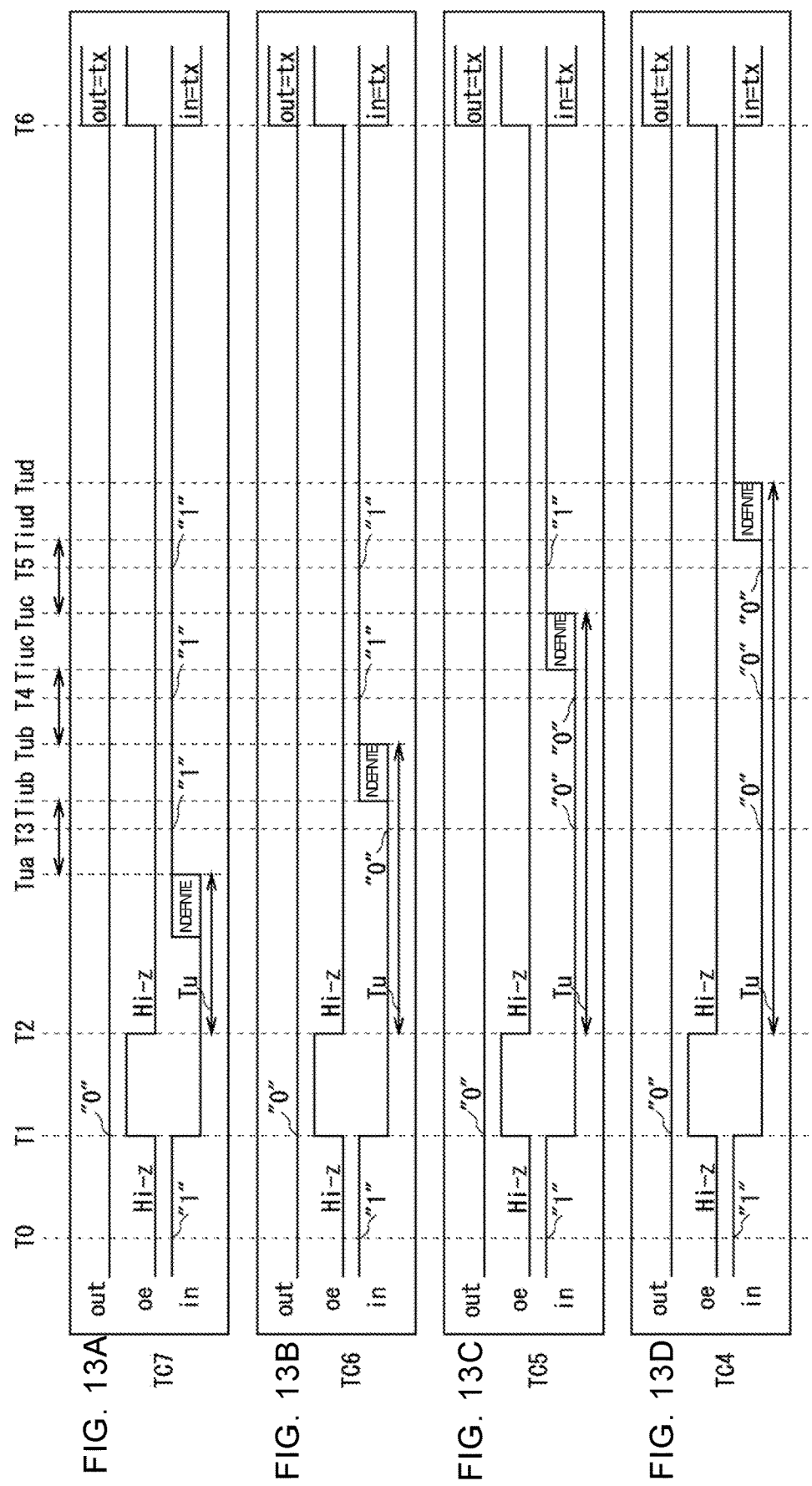
Figure 14:
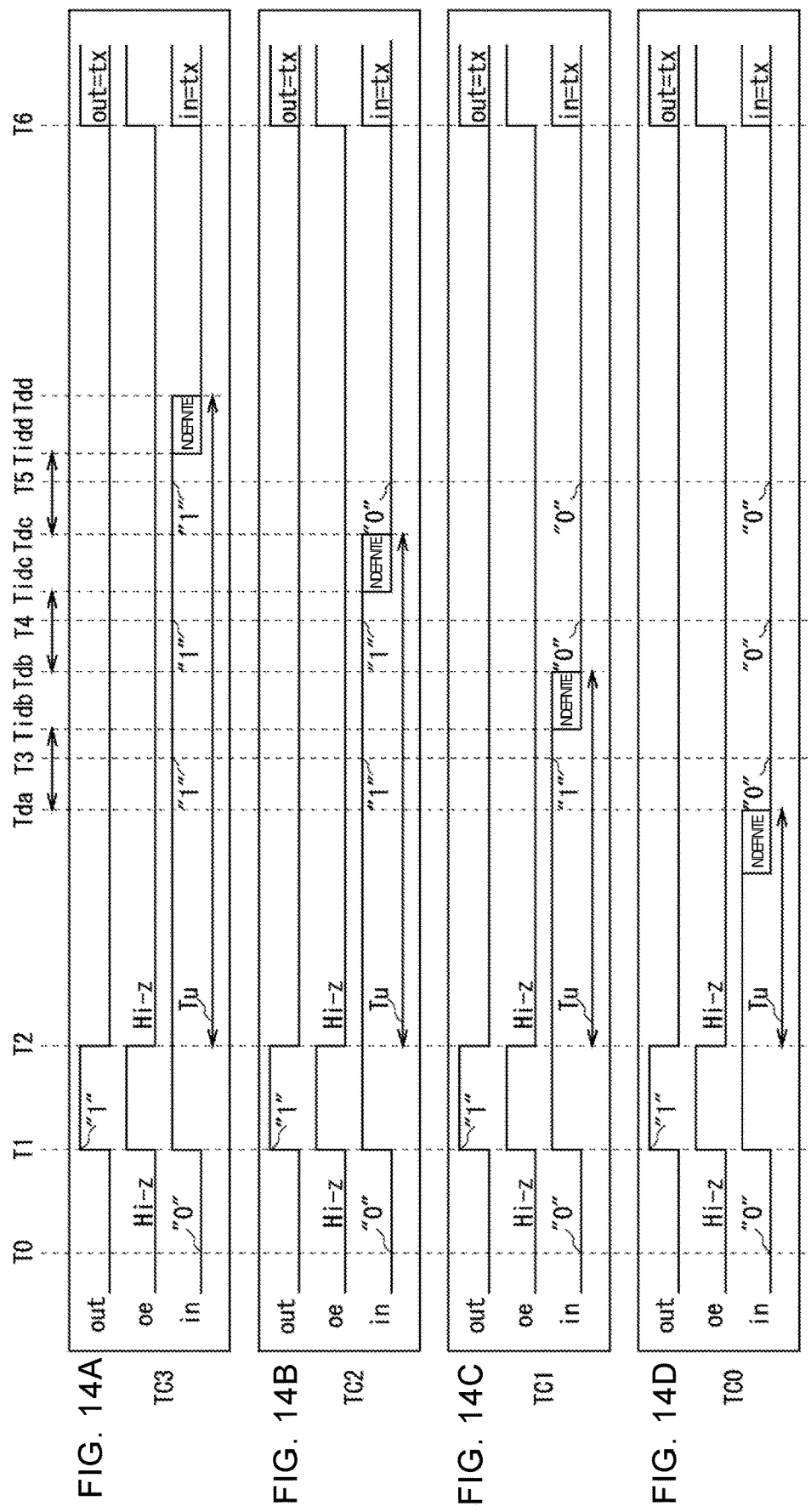

Times Tua, Tub, Tuc, and Tud in FIG. 13 are the time lengths from time T2 to the time when "in =1" is determined, in the cases where the resistor 6a, 6b, 6c, and 6d are mounted to the resistor mounting position MPu, respectively. Times Tda, Tdb, Tdc, and Tdd in FIG. 14 are the time lengths from time T2 to the time when "in =0" is determined, in the cases where the resistors 6a, 6b, 6c, and 6d are mounted to the resistor mounting position MPI, respectively.

Times Tiub, Tiuc, and Tiud in FIG. 13 are the time lengths from time T2 to the time when the IN signal become indefinite, in the cases where the resistors 6b, 6c, and 6d are mounted to the resistor mounting position MPu, respectively. Times Tidb, Tidc, and Tidd in FIG. 14 are the time lengths from time T2 to the time when the IN signal become indefinite, in the cases where the resistors 6b, 6c, and 6d are mounted to the resistor mounting position MPI, respectively.

As illustrated in FIGS. 11 and 12, the following values are obtained, respectively, in a second embodiment. In the case where the resistor 6a is mounted at the resistor mounting position MPu, time Tua is 47 µs. In the case where the resistor 6b is mounted at the resistor mounting position MPu, time Tiub is 70 µs and time Tub is 238 µs. In the case where the resistor 6c is mounted at the resistor mounting position MPu, time Tiuc is 277 µs and time Tuc is 932 µs. In the case where the resistor 6d is mounted at the resistor mounting position MPu, time Tiud is 1388 µs. In the case where the resistor 6a is mounted at the resistor mounting position MPI, time Tda is 71 µs. In the case where the resistor 6b is mounted at the resistor mounting position MPI, time Tidb is 127 µs and time Tdb is 362 µs. In the case where the resistor 6c is mounted at the resistor mounting position MPI, time Tidc is 500 µs and time Tdc is 1417 µs. In the case where the resistor 6d is mounted at the resistor mounting position MPI, time Tidd is 2503 µs.

Figure 15:
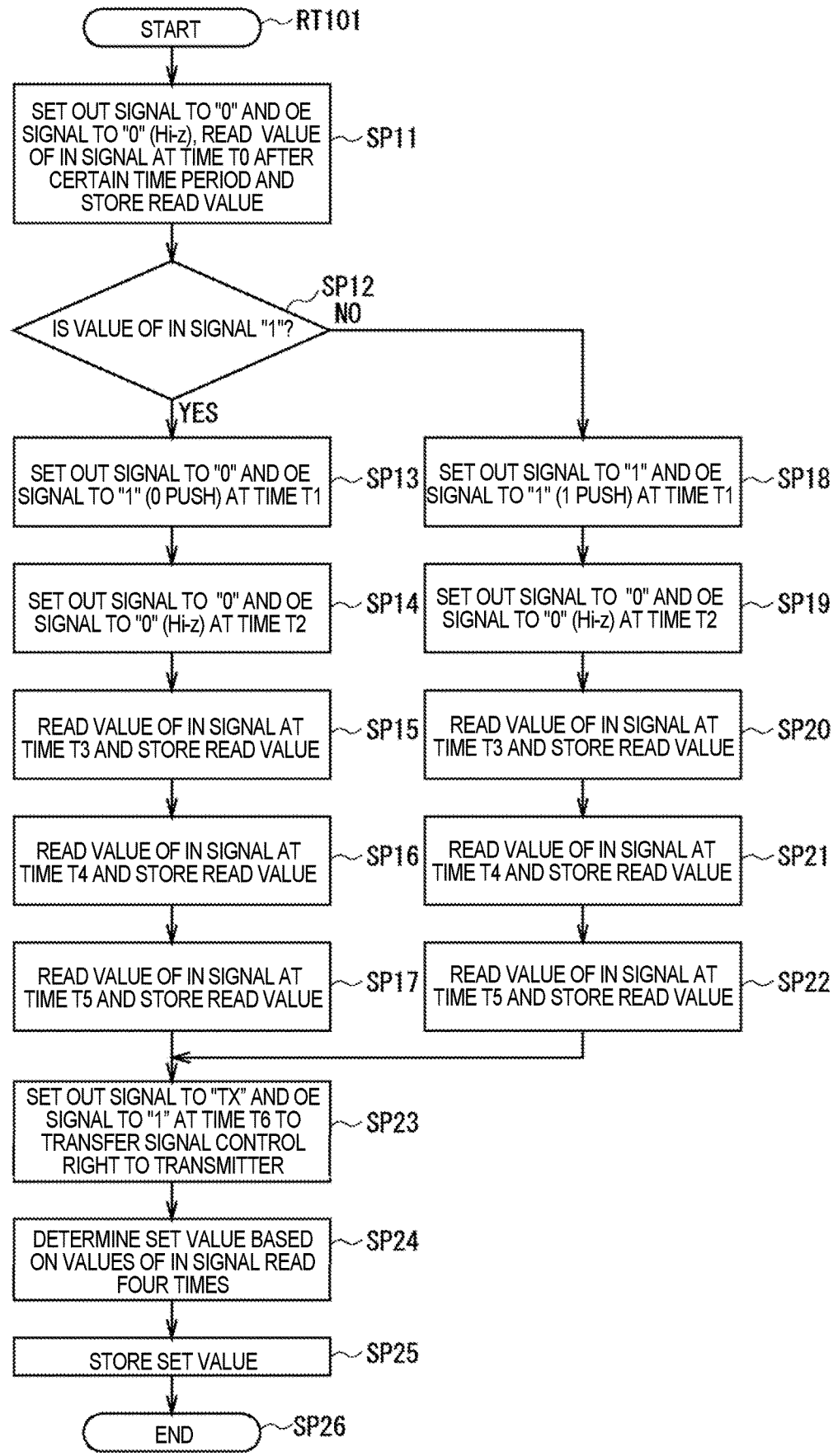
FIG. 15 is a flowchart illustrating a set value reading processing procedure according to a second embodiment.

Times T3, T4 and T5 illustrated in FIGS. 13A to 14D are the times when the IO buffer control unit 114 reads the value of the IN signal in steps SP15, SP16 and SP17 in the set value reading processing procedure RT101 in FIG. 15, or steps SP20, SP21, and SP22 in the set value reading processing procedure RT101 in FIG. 15.

In the case where the resistor 6 is mounted at the resistor mounting position MPu, times T3, T4 and T5 are set such that the Tua<T3<Tiub, Tub<T4<Tiuc, and Tuc<T5<Tiud. Specifically, in a second embodiment, in the case where the resistor 6 is mounted at the resistor mounting position MPu, time T3 is 60 µs, time T4 is 260 µs, and time T5 is 1100 µs.

In the case where the resistor 6 is mounted at the resistor mounting position MPI, times T3, T4 and T5 are set such that Tda<T3<Tidb, Tdb<T4<Tidc, and Tdc<T5<Tidd. Specifically, in a second embodiment, in the case where the resistor 6 is mounted at the resistor mounting position MPI, time T3 is 100 µs, time T4 is 450 µs, and time T5 is 1600 µs.

(2-6. Set Value Replacement Correspondence Table)

Here, the value of the IN signal read by the IO buffer control unit 114 at step SP11 (first time point) in the set value reading processing procedure RT101 (FIG. 15) may also be referred to as a read value at the first time point (or a first time point read value). Further, the value of the IN signal read by the IO buffer control unit 114 at step SP15 or SP20 (third time point) in the set value reading processing procedure RT101 may also be referred to as a read value at the third time point (or a third time point read value). Further, the value of the IN signal read by the IO buffer control unit 114 at step SP16 or SP21 (fourth time point) in the set value reading processing procedure RT101 may also be referred to as a read value at the fourth time point (or a fourth time point read value). Further, the value of the IN signal read by the IO buffer control unit 114 at step SP17 or SP22 (fifth time point) in the set value reading processing procedure RT101 may also be referred to as a read value at the fifth time point (or a fifth time point read value).

FIG. 16 illustrates the set value replacement correspondence table TB1. The set value reading correspondence table TB1 is a table that is used to replace (i.e., convert) the values of the IN signal read by the IO buffer control unit 114 four times at the first, third, fourth, and fifth time points in the set value reading processing procedure RT101, to the actual current set value. For example, when the read values at the first, third, fourth, and fifth time points are all "1, the current set value is determined to be 7 (i.e., "111b" in binary representation).

(2-7. Set Value Reading Process)

The IO buffer control unit 114 reads the set values before the firmware is started up after the power-on of the semiconductor integrated circuit 103, which is called the set value reading process. Next, with reference to the timing charts in FIGS. 13A to 13D and 14A to 14D and the flowchart in FIG. 15, the set value reading processing procedure RT101, which is a specific processing procedure of the set value reading process, will be described for three patterns as representatives out of eight combinations (eight patterns) of the resistor mounting position MP and the resistance constant R. The IO buffer control unit 114 initiates the set value reading processing procedure RT101 to proceed to step SP11.

(2-7-1. Set Value 7)

First, a case where the resistor 6a having the resistor constant Ra is mounted to the resistor mounting position MPu and no resistor is mounted to the resistor mounting position MPI as illustrated in FIG. 10A, which is the case of the set value being 7, will be explained with reference to the timing chart TC7 illustrated in FIG. 13A.

In step SP11 after the power is turned on, the IO buffer control unit 114 sets the output signals to "out=0" and "oe=0" so as to set the IO buffer 12 to the high impedance state, reads, at time T0 after a lapse of a certain time period, the value of the IN signal as a first signal at a first time point (a first time point read value), stores the first time point read value in the memory 18, and proceeds to step SP12. Note that, in practice, when the reset signal of the semiconductor integrated circuit 103 is turned off from on after the semiconductor integrated circuit 103 is turned on, the 10 buffer control unit 114 reads at time T0 the value of the IN signal. Here, since the resistor 6a is mounted at the resistor mounting position MPu and the signal line L is pulled up to 3.3 V, the IN signal read in step SP11 is "1". In step SP12, the IO buffer control unit 114 determines whether or not the value of the IN signal read in step SP11 is "1". Here, the value of the IN signal read in step SP1 is "1", so the IO buffer control unit 114 obtains a positive result in step SP12, and then proceeds to step SP13.

In step SP13, the IO buffer control unit 114 sets at time T1 the output signals to "out=0" and "oe=1" so as to cause the IO buffer 12 to output "0" as a second signal at a second time point (a second time point read value), and after a certain time period, proceeds to step SP14. In this step SP13, the IO buffer control unit 114 outputs the OUT signal whose value has the logic level different from the value of the IN signal read in step SP11.

In step SP14, the IO buffer control unit 114 sets at time T2 the output signals thereof to "out=0" and "oe=0" again so as to set the IO buffer 12 to the high impedance state, reads, after 60 μs elapse, the value of the IN signal, and proceeds to step SP15. Note that since the clock frequency of the OSC4 is 10 MHz (the clock cycle is 0.1 μs), the IO buffer control unit 114 counts the progress of 60 μs by waiting 6000 clocks.

In step SP15, the IO buffer control unit 114 reads at time T3 the value of the IN signal as a third signal at a third time point (a third time point read value), stores the read value in memory 18, and, after 260 μs have elapsed from the time (time T2) when the IO buffer 12 is put into the high impedance state in step SP14, proceeds to step SP16.

In step SP16, the IO buffer control unit 114 reads at time T4 the value of the IN signal as a fourth signal at a fourth time point (a fourth time point read value) and stores the read value in memory 18, and, after 1100 μs have elapsed from the time (time T2) when the IO buffer 12 is put into the high impedance state in step SP14, proceeds to step SP17.

In step SP17, the IO buffer control unit 114 reads at time T5 the value of the IN signal as a fifth signal at a fifth time point (a fifth time point read value), stores the read value in memory 18, and proceeds to step SP23. Here, the resistance constant is Ra. In this case, after 47 μs elapse from time T2 (t=0 μs in FIG. 11), the potential Vc of the signal line L in the case of the resistance constant Rs becomes Vc>Vih (2.0 V), that is, the IN signal becomes 1 ("in =1"). That is, the IN signal is 1 ("in =1") even at the times T3, T4, and T5 when 95 μs or more have passed from the time T2.

In step SP23, the IO buffer control unit 114 sets the output signals to "out=tx" and "oe=1" at time T6 so as to transfer the signal control right of the IO buffer 12 to the transmitter 16, and proceeds to step SP24.

In step SP24, the IO buffer control unit 14 determines the current set value based on the values of the IN signal read in steps SP11, SP15, SP16, and SP17, and proceeds to step SP25. Specifically, the IO buffer control unit 114 determines, based on the read values at the first, third, fourth, and fifth time point read in steps SP11, SP15, SP16 and SP17 being all "1", that the current set value is 7 (i.e., "111b" in binary representation), with reference to the set value replacement correspondence table TB1 (FIG. 16).

In step SP25, the IO buffer control unit 114 stores the determined set value in the memory 18 and proceeds to step SP26 to complete the set value reading processing procedure RT101. In this way, the IO buffer control unit 114 reads the value of the IN signal four times, and determines the set value based on the values of the IN signal read at the first, third, fourth, and fifth time points, with reference to the set value replacement correspondence table TB 1 (FIG. 16).

(2-7-2. Set Value 5)

Next, a case where the resistor 6c having the resistor constant Rc is mounted to the resistor mounting position MPu and no resistor is mounted to the resistor mounting position MPl as illustrated in FIG. 10C, which is the case of the set value being 5, will be explained with reference to the timing chart TC5 illustrated in FIG. 13C.

In step SP11 after the power is turned on, the IO buffer control unit 114 sets the output signals thereof to "out=0" and "oe=0" so as to set the IO buffer 12 to a high impedance state, reads, at time T0 after a lapse of a certain time period, the value of the IN signal as a first signal at a first time point (the first time point read value), stores the first time point read value in the memory 18, and proceeds to step SP12. Here, since the resistor 6c is mounted at the resistor mounting position MPu and the signal line L is pulled up at 3.3 V, the IN signal is "1". In step SP12, the 10 buffer control unit 114 determines whether or not the value of the IN signal read in step SP11 is "1". Here, the value of the IN signal read in step SP1 is "1", so the 10 buffer control unit 114 obtains a positive result in step SP12, and then proceeds to step SP13.

In step SP13, the IO buffer control unit 114 sets at time T1 the output signals to "out=0" and "oe=1" so as to cause the IO buffer 12 to output "0" as a second signal at a second time point, and after a certain time period, proceeds to step SP14. In this step SP13, the IO buffer control unit 114 outputs the OUT signal whose value has the logic level different from the value of the IN signal read in step SP11.

In step SP14, the IO buffer control unit 114 sets at time T2 the output signals thereof to "out=0" and "oe=0" so as to set the IO buffer 12 to the high impedance state again, reads, after 60 μs elapse, the value of the IN signal, and proceeds to step SP15.

In step SP15, the IO buffer control unit 114 reads at time T3 the value of the IN signal as a third signal at a third time point, stores the read value in memory 18, and, after 260 μs have elapsed from the time (time T2) when the IO buffer 12 is put into the high impedance state in step SP14, proceeds to step SP16.

In step SP16, the IO buffer control unit 114 reads at time T4 the value of the IN signal as a fourth signal at a fourth time point and stores the read value in memory 18, and, after 1100 μs have elapsed from the time (time T2) when the 10 buffer 12 is put into the high impedance state in step SP14, proceeds to step SP17.

In step SP17, the IO buffer control unit 114 reads at time T5 the value of the IN signal as a fifth signal at a fifth time point, stores the read value in memory 18, and proceeds to step SP23. Here, the resistance constant is Rc. In this case, from time T2 (t=0 μs in FIG. 11) until the time when 227 μs have elapsed from time T2, the potential Vc of the signal line L in the case of the resistance constant Rc is smaller than Vil (Vc<Vil (0.8 V)), and thus the IN signal is maintained to 0 ("in =0"). Thus, the IN signal is 0 ("in =0") at times T3 and T4 before 227 μs have elapsed from time T2. In this case, after 1100 μs elapse from time T2 (t=0 μs in FIG. 11), the potential Vc of the signal line L in the case of the resistance constant Rc becomes larger than Vih (Vc>Vih (2.0 V)), that is, the IN signal becomes 1 ("in =1"). That is, the IN signal is 1 ("in =1") even at the time T5 when 1100 μs or more have passed from the time T2.

In step SP23, the IO buffer control unit 114 sets the output signals to "out=tx" and "oe=1" at time T6 so as to transfer the signal control right of the IO buffer 12 to the transmitter 16, and proceeds to step SP24.

In step SP24, the IO buffer control unit 14 determines the current set value based on the values of the IN signal read in steps SP11, SP15, SP16, and SP17, and proceeds to step SP25. Specifically, the read value at the first time point read in step SP11 is "1", the read values at the third and fourth time points read in steps SP15 and SP16 are "0", and the read value at the fifth time point read in step SP17 is "1". Accordingly, the IO buffer control unit 114 determines that the current set value is 5 (i.e., "101b" in binary representation) based on the read values at the first, third, fourth, and fifth time point read in steps SP11, SP15, SP16 and SP17, with reference to the set value replacement correspondence table TB1 (FIG. 16).

In step SP25, the IO buffer control unit 114 stores the determined set value in the memory 18 and proceeds to step SP26 to complete the set value reading processing procedure RT101.

(2-7-3. Set Value 1)

Next, a case where the resistor 6b having the resistor constant Rb is mounted to the resistor mounting position MPl and no resistor is mounted to the resistor mounting position MPu as illustrated in FIG. 10G, which is the case of the set value being 1, will be explained with reference to the timing chart TC1 illustrated in FIG. 14C.

In step SP11 after the power is turned on, the IO buffer control unit 114 sets the output signals thereof to "out=0" and "oe=0" so as to set the IO buffer 12 to a high impedance state, reads, at time T0 after a lapse of a certain time period, the value of the IN signal as a first signal at a first time point (the first time point read value), stores the first time point read value in the memory 18, and proceeds to step SP12. Here, since the resistor 6b is mounted at the resistor mounting position MPl and the signal line L is pulled down at 0 V, the IN signal is "0". In step SP12, the 10 buffer control unit 114 determines whether or not the value of the IN signal read in step SP11 is "1". Here, the value of the IN signal read is "0", so the IO buffer control unit 114 obtains a negative result in step SP12, and thus proceeds to step SP18.

In step SP18, the IO buffer control unit 114 sets at time T1 the output signals thereof to "out=1" and "oe=1" so as to cause the IO buffer 12 to output "1" as a second signal at a second time point, and after a certain time period, proceeds to step SP19. In this step SP18, the IO buffer control unit 114 outputs the OUT signal whose value has the logic level different from the value of the IN signal read in step SP11.

In step SP19, the IO buffer control unit 114 sets at time T2 the IO buffer 12 to the high impedance state again by setting the output signals thereof to "out=0" and "oe=0", and, after 100 µs elapse, proceeds to step SP20.

In step SP20, the IO buffer control unit 114 reads at time T3 the value of the IN signal as a third signal at a third time point, stores the read value in memory 18, and, after 450 µs have elapsed from the time (time T2) when the IO buffer 12 is put into the high impedance state in step SP19, proceeds to step SP22.

In step SP21, the IO buffer control unit 114 reads at time T4 the value of the IN signal as a fourth signal at a fourth time point, stores the read value in memory 18, and, after 1600 µs have elapsed from the time (time T2) when the IO buffer 12 is put into the high impedance state in step SP19, proceeds to step SP22.

In step SP22, the IO buffer control unit 114 reads at time T5 the value of the IN signal as a fifth signal at a fifth time point, stores the read value in memory 18, and proceeds to step SP23. Here, the resistance constant is Rb. In this case, from time T2 (t=0 µs in FIG. 12) until time T7 when 127 µs have elapsed from time T2, the potential Vc of the signal line L in the case of the resistance constant Rb is greater than Vih (Vc>Vih (2.0 V)), and thus the IN signal is maintained at 1 ("in =1"). Therefore, the IN signal is 1 ("in =1"), at time T3 before 127 µs have elapsed from time T2. In this case, after 362 µs elapse from time T2 (t=0 µs in FIG. 12), the potential Vc of the signal line L in the case of the resistance constant Rb becomes larger than Vih (Vc>Vih (0.8 V)), that is, the IN signal becomes 0 ("in =0"). That is, even at times T4 and T5 when 362 µs or more have passed from the time T2, the IN signal is 0 ("in =0").

In step SP23, the IO buffer control unit 114 sets the output signals to "out=tx" and "oe=1" at time T6 so as to transfer the signal control right of the IO buffer 12 to the transmitter 16, and proceeds to step SP24.

In step SP24, the IO buffer control unit 14 determines the current set value based on the values of the IN signal read in steps SP11, SP20, SP21, and SP22, and proceeds to step SP25. Specifically, the read value at the first time point read in step SP11 is "0", the read values at the third time point SP16 read in step SP15 is "1", and the read values at the fourth and fifth time points read in steps SP16 and SP17 are "0". Accordingly, the IO buffer control unit 114 determines that the current set value is 1 (i.e., "001 b" in binary representation) based on the read values at the first, third, fourth, and fifth time point read in steps SP11, SP15, SP16 and SP17, with reference to the set value replacement correspondence table TB1 (FIG. 16).

In step SP25, the IO buffer control unit 114 stores the determined set value in the memory 18 and proceeds to step SP26 to complete the set value reading processing procedure RT101.

(2-8. Effects)

In the above configuration, the circuit board 102 is configured such that, depending on the set value to be used in the initial operation of the semiconductor integrated circuit 103, one of the resistors 6a, 6b, 6c, and 6d whose resistance values are different from each other, is selectively mounted on one of the resistor mounting positions MPu and MPl. That is, the circuit board 102 is configured such that the resistance values of the pull-up resistor and the pull-down resistor are different from each other.

The semiconductor integrated circuit 3 first reads the state of the terminal 11 in the high impedance state so as to obtain one bit of the set value, and next changes the state of the terminal 11 once to 0 or 1, which has the logic level different from the state read earlier, returns the state of the terminal to the high impedance state, and reads again three times (times T3, T4, and T5) the state of the terminal 11 again, so as to obtain three more bits of the set value. Therefore, the semiconductor integrated circuit 103 can take in the set value of 3 bits (eight different set values) in the terminal 11, which is the single terminal.

In a conventional art, a set value of 1 bit per terminal is read in a high impedance state by using a pull-up resistor or a pull-down resistor having one resistance value. However, since the semiconductor integrated circuit 103 is configured as described above, even when the number of terminals that can be used to capture the information of the set value is the same as that of the conventional art, the semiconductor integrated circuit 3 can capture four times the number of the set values than the conventional art.

In other respects, the semiconductor integrated circuit 103 according to a second embodiment can achieve effects same as or similar to the semiconductor integrated circuit 3 according to a first embodiment.

(3. Third Embodiment)

(3-1. Printer Configuration)

As illustrated in FIG. 17, in which the same reference numerals are designated to elements corresponding to those in FIGS. 1 and 8, a printer 201 according to a third embodiment is different from the printer 101 according to a second embodiment in that a circuit board 202 is provided in place of the circuit board 102, but the other configurations are the same as in a second embodiment.

(3-2. Configuration of Circuit Board)

As illustrated in FIG. 17, the circuit board 202 according to a third embodiment is different from the circuit board 102 according to a second embodiment in that a semiconductor integrated circuit 203 is provided in place of the semiconductor integrated circuit 103, but the other configurations are the same as in a second embodiment. The semiconductor integrated circuit 203 according to a third embodiment is different from the semiconductor integrated circuit 103 according to a second embodiment in that an IO buffer control unit 214 is provided in place of the IO buffer control unit 114 and a time measurement unit 20 is added, but the other configurations are the same as or similar to those of a second embodiment. FIG. 18 illustrates an equivalent circuit of the circuit board 202 with the capacitor 8 and the opposing device 10 being replaced by the capacitor 9 having a load capacitance equivalent to those of the capacitor 8 and the opposing device 10.

The time measurement unit 20 measures, under the control of the IO buffer control unit 214, a logic level reversal time Tu, which is a time length from the time (time T2) when the IO buffer 12 is put into the high impedance state in step SP14 or SP19 in a set value reading processing procedure RT201 (described below) to the time at which the logic level of the IN signal is reversed in step SP31 or SP32.

(3-3. Combinations of Resistor Mounting Position and Resistor Constant)

As illustrated in FIGS. 10A to 10H, combinations between the resistor mounting positions MPu or MPl where the resistor 6 is mounted on the circuit board 202, and the resistance constant Rb, Rc, or Rd of the resistor 6 are the same as in a second embodiment.

(3-4. Relationship between Elapsed Time and Potential of Signal Line) (3-4-1. Case where the resistor 6a, 6b, 6c or 6d is mounted at the resistor mounting position MPu)

As illustrated in FIG. 11, the graph of a change in the potential of the potential Vc of the signal line L, starting from L=0 V in the state where the IO buffer 12 is in the high impedance state (in the setting "oe=0") in the case where the resistor 6a, 6b, 6c, or 6d is mounted to the resistor mounting position MPu, which is calculated by using the step response calculation formula for the RC circuit, is the same as in a second embodiment.

(3-4-2. Case where the Resistor 6a, 6b, 6c or 6d is Mounted at the Resistor Mounting Position MPl)

As illustrated in FIG. 12, the graph of a change in the potential of the potential Vc of the signal line L, starting from L=3.3 V in the state where the IO buffer 12 is in the high impedance state (in the setting "oe=0") in the case where the resistor 6a, 6b, 6c, or 6d is mounted to the resistor mounting position MPl, which is calculated by using the step response calculation formula for the RC circuit, is the same as in a second embodiment.

(3-5. Timing Charts)

As illustrated in FIGS. 13A to 13D and 14A to 14D, timing charts of the signals (the OUT signal, the OE signal, and the IN signal) between the IO buffer control unit 14 and the IO buffer 12 for each combination of the resistor mounting position MP and the resistor constant R are the same as in a second embodiment.

(3-6. Set Value Replacement Correspondence Table)

Here, at step SP11 (first time point) in the set value reading processing procedure RT201 (FIG. 19), the value of the IN signal read by the IO buffer control unit 214 may also be referred to as a read value at the first time point (or a first time point read value).

FIG. 20 illustrates the set value replacement correspondence table TB201. The set value reading correspondence table TB201 is a table that is used to replace (i.e., convert) the values of the IN signal read by the IO buffer control unit 114 in the set value reading processing procedure RT201 and the measured logic level reversal time Tu, to the actual current set value. In the set value replacement correspondence table TB201, corresponding to the four resistance values of the resistors 6a, 6b, 6c, and 6d, there are four different determination ranges, having predetermined time periods respectively, for the measured logic level reversal time Tu. The IO buffer control unit 214 determines which one of the four determination ranges in the set value replacement correspondence table TB201 the measured logic level reversal time Tu corresponds to (falls on). In a third embodiment, the four determination ranges of the measured logic level reversal time Tu are set to be same as each other between the case where the resistor 6 is mounted to the resistor mounting position MPu and the case where the resistor 6 is mounted to the resistor mounting position MPl. For example, when the read values at the first time point is "1" and the measured logic level reversal time Tu is less than 80 μs, the current set value is determined to be 7 (i.e., "111b" in binary representation).

(3-7. Set Value Reading Process)

Figure 19:
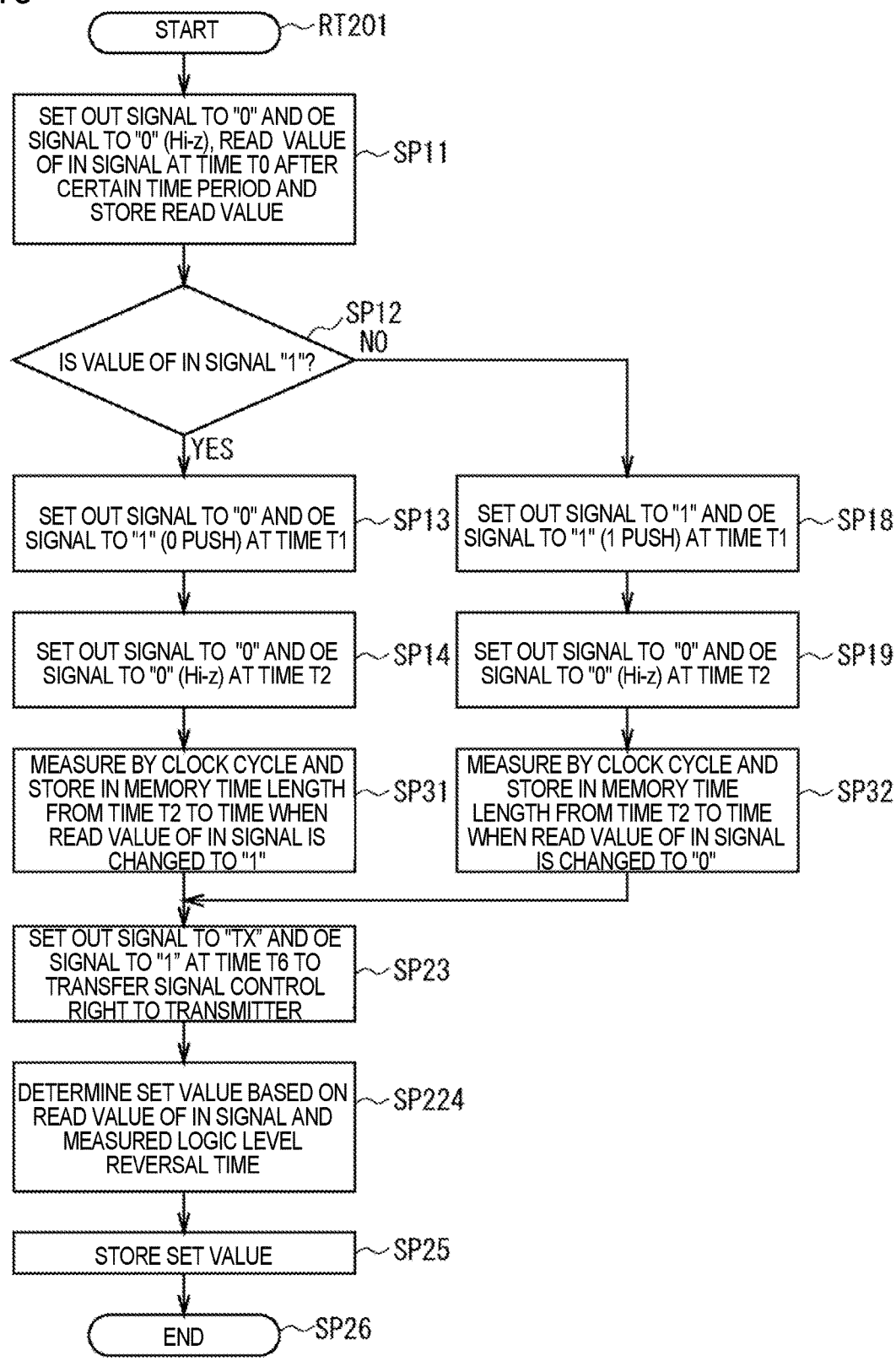
FIG. 19 is a flowchart illustrating a set value reading processing procedure according to a third embodiment.

Next, with reference to the timing charts in FIGS. 13A to 14D and the flowchart in FIG. 19 in which the same reference numerals are designated to the steps as in FIG. 15, a set value reading processing procedure RT201, which is a specific processing procedure of the set value reading process, in which the 10 buffer control unit 214 reads the set value before the firmware is started up after the power-on of the semiconductor integrated circuit 203, will be described for three patterns as representatives out of eight combinations (eight patterns) of the resistor mounting position MP and the resistance constant R. The set value reading processing procedure RT201 is different from the set value reading processing procedure RT101 (FIG. 15), in that steps SP15, SP16 and SP17 are replaced with step SP31, steps SP20, SP21, and SP22 are replaced with step SP32, and step SP24 is replaced with step SP224, respectively, but the other steps are the same as in the set value reading processing procedure RT101. The IO buffer control unit 214 initiates the set value reading processing procedure RT201, and proceeds to step SP11

(3-7-1. Set Value 7)

First, a case where the resistor 6a having the resistor constant Ra is mounted to the resistor mounting position MPu and no resistor is mounted to the resistor mounting position MPl as illustrated in FIG. 10A, which is the case of the set value being 7, will be explained with reference to the timing chart TC7 illustrated in FIG. 13A.

In steps SP11 to SP13, the IO buffer control unit 214 performs the processes same as in the set value reading processing procedure RT101 (see FIG. 15), and proceeds to step SP14. In step SP14, the IO buffer control unit 214 sets at time T2 the output signals thereof to "out=0" and "oe=0" again so as to set the IO buffer 12 to the high impedance state, and proceeds to step SP31.

In step SP31, the IO buffer control unit 214 monitors the value of the IN signal as the third signal at the third time point by reading it at the clock cycles, measures by means of the time measurement unit 20, a time length from the time (time T2) when the IO buffer 12 is put in the high impedance state at SP14 to the time when the IN signal is changed from 0 ("in =0") to 1 ("in =1") (i.e., the time when the logic level of the read value is inverted), stores the time length in the memory 18, and proceeds to step SP23. Note that since the clock frequency of the OSC4 is 10 MHz (the clock cycle 0.1 µs), the IO buffer control unit 114 monitors the value of the IN signal at 0.1 µs intervals. Here, the resistance constant is Ra. In this case, after 47 µs elapse from time T2 (t=0 µs in FIG. 11), the potential Vc of the signal line L in the case of the resistance constant Rs becomes larger than Vih (Vc>Vih (2.0 V)), that is, the IN signal becomes 1 ("in =1"). Accordingly, the measure logic level reversal time Tu, measured by the time measurement unit 20, is 47 µs.

In step SP23, the IO buffer control unit 214 performs the processes same as in the set value reading processing procedure RT101 (see FIG. 15), and proceeds to step SP224.

In step SP224, the IO buffer control unit 214 determines the current set value based on the value of the IN signal read in step SP11 and the measured logic level reversal time measured in step SP31, and proceeds to step SP25. Specifically, the IO buffer control unit 214 determines, based on the read value at the first time point read in steps SP11 being 1 and the measured logic level reversal time Tu measured in step SP31 being 47 µs, that the current set value is 7 (i.e., "111b" in binary representation), with reference to the set value replacement correspondence table TB201 (FIG. 20).

In step SP25, the IO buffer control unit 214 performs the processes same as in the set value reading processing procedure RT101 (see FIG. 15), and proceeds to step SP201 to complete the set value reading processing procedure RT201. Thus, the IO buffer control unit 214 reads (detects) the value of the "in" signal at time T0 (the read value at the first time point) once, outputs from the OUT signal line a value whose logic level is different from that of the IN signal at time T1, puts the IO buffer 12 in the high impedance state again in time T2, measures the time length (the logic level reversal time Tu) from time T2 to the time when the value of the IN signal is changed (returned) to the value read at time 0, and determines, based on the read value at the first time point and the measured logic level reversal time Tu with reference to the set value reading correspondence table TB201 (FIG. 20), the set value.

(3-7-2. Set Value 5)

Next, a case where the resistor 6c having the resistor constant Rc is mounted to the resistor mounting position MPu and no resistor is mounted to the resistor mounting position MPl as illustrated in FIG. 10C, which is the case of the set value being 5, will be explained with reference to the timing chart TC5 illustrated in FIG. 13C.

In steps SP11 to SP13, the IO buffer control unit 214 performs the processes same as in the set value reading processing procedure RT101 (see FIG. 15), and proceeds to step SP14. In step SP14, the IO buffer control unit 214 sets at time T2 the output signals thereof to "out=0" and "oe=0" again so as to set the IO buffer 12 to the high impedance state, and proceeds to step SP31.

In step SP31, the IO buffer control unit 214 monitors the value of the IN signal as the third signal at the third time point by reading it at the clock cycles, measures by means of the time measurement unit 20, a time length from the time (time T2) when the IO buffer 12 is put in the high impedance state at SP14 to the time when the IN signal is changed from 0 ("in =0") to 1 ("in =1") (i.e., the time when the logic level of the read value is inverted), stores the time length in the memory 18, and proceeds to step SP23. Here, the resistance constant is Rc. In this case, after 932 µs elapse from time T2 (t=0 µs in FIG. 11), the potential Vc of the signal line L in the case of the resistance constant Rc becomes larger than Vih (Vc>Vih (2.0 V)), that is, the IN signal becomes 1 ("in =1"). Accordingly, the measured logic level reversal time Tu, measured by the time measurement unit 20, is 932 µs.

In step SP23, the IO buffer control unit 214 performs the processes same as in the set value reading processing procedure RT101 (see FIG. 15), and proceeds to step SP224.

In step SP224, the IO buffer control unit 214 determines the current set value based on the value of the IN signal read in step SP11 and the measured logic level reversal time measured in step SP31, and proceeds to step SP25. Specifically, the IO buffer control unit 214 determines, based on the read value at the first time point read in steps SP11 being 1 and the measured logic level reversal time Tu measured in step SP31 being 932 µs, that the current set value is 5 (i.e., "101b" in binary representation), with reference to the set value replacement correspondence table TB201 (FIG. 20).

In step SP25, the IO buffer control unit 214 performs the processes same as in the set value reading processing procedure RT101 (see FIG. 15), and proceeds to step SP201 to complete the set value reading processing procedure RT201.

(3-7-3. Set Value 1)

Next, a case where the resistor 6b having the resistor constant Rb is mounted to the resistor mounting position MPl and no resistor is mounted to the resistor mounting position MPu as illustrated in FIG. 10G, which is the case of the set value being 1, will be explained with reference to the timing chart TC1 illustrated in FIG. 14C.

In steps SP11, SP12 and SP18, the IO buffer control unit 214 performs the procedure same as in the set value reading processing procedure RT101 (see FIG. 15), and proceeds to step SP19. In step SP19, the IO buffer control unit 214 sets at time T2 the output signals thereof to "out=0" and "oe=0" again so as to set the IO buffer 12 to the high impedance state, and proceeds to step SP32.

In step SP32, the IO buffer control unit 214 monitors the value of the IN signal as the third signal at the third time point by reading it at the clock cycles, measures by means of the time measurement unit 20, a time length from the time (time T2) when the IO buffer 12 is put in the high impedance state at SP19 to the time when the IN signal is changed from 1 ("in =1") to 0 ("in =0") (i.e., the time when the logic level of the read value is inverted), stores the time length in the memory 18, and proceeds to step SP23. Here, the resistance constant is Rb. In this case, after 362 µs elapse from time T2 (t=0 µs in FIG. 12), the potential Vc of the signal line L in the case of the resistance constant Rb becomes less than Vil (Vc<Vil (0.8 V)), that is, the IN signal becomes 0 ("in =0"). Accordingly, the measured logic level reversal time Tu, measured by the time measuring unit 20, is 362 µs.

In step SP23, the IO buffer control unit 214 performs the processes same as in the set value reading processing procedure RT101 (see FIG. 15), and proceeds to step SP224.

In step SP224, the IO buffer control unit 214 determines the current set value based on the value of the IN signal read in step SP11 and the measured logic level reversal time measured in step SP32, and proceeds to step SP25. Specifically, the IO buffer control unit 214 determines, based on the read value at the first time point read in steps SP11 being 1 and the measured logic level reversal time Tu measured in step SP32 being 362 µs, that the current set value is 1 (i.e., "001 b" in binary representation), with reference to the set value replacement correspondence table TB201 (FIG. 20).

In step SP25, the IO buffer control unit 214 performs the processes same as in the set value reading processing procedure RT101 (see FIG. 15), and proceeds to step SP201 to complete the set value reading processing procedure RT201.

(3-8. Effects)

In the above configuration, the circuit board 202 is configured such that, depending on the set value to be used in the initial operation of the semiconductor integrated circuit 203, one of the resistors 6*a*, 6*b*, 6*c*, and 6*d* whose resistance values are different from each other, is selectively mounted on one of the resistor mounting positions MPu and MPl. That is, the circuit board 202 is configured such that the resistance values of the pull-up resistor and the pull-down resistor are different from each other.

Further, the semiconductor integrated circuit 203 first reads the state of the terminal 11 in the high impedance state so as to obtain one bit of the set value, and next changes the state of the terminal 11 to 0 or 1, which has the logic level different from the state read earlier, returns the state of the terminal to the high impedance state, and, after that, measures the time length (the logic level reversal time Tu), which is the time length until the time when the state of the terminal is changed. Therefore, the semiconductor integrated circuit 203 can take in the set value of 3 bits (eight different set values) in the terminal 11, which is the single terminal.

In a conventional art, a set value of 1 bit per terminal is read in a high impedance state by using a pull-up resistor or a pull-down resistor having one resistance value. However, since the semiconductor integrated circuit 203 is configured as described above, even when the number of terminals that can be used to capture the information of the set value is the same as that of the conventional art, the semiconductor integrated circuit 3 can capture four times the number of the set values than the conventional art.

In addition, the semiconductor integrated circuit 203 is configured to determine the set value based on the time length (the measured logic level reversal time Tu) from the time when the terminal 11 is returned into the high impedance state again to the time when the state of the terminal 1 is changed. Accordingly, the shorter the measured logic level reversal time Tu, the shorter the set value can be determined. Therefore, in the case where the measured logic level reversal time Tu is short, the semiconductor integrated circuit 203 can determine the set value in a shorter time than a case (a second embodiment) where the semiconductor integrated circuit determines the set value by reading the state of the terminal the plural times at the predetermined time intervals after the terminal 11 is returned into the high impedance state again.

In other respects, the semiconductor integrated circuit 203 according to a third embodiment can achieve effects same as or similar to the semiconductor integrated circuit 103 according to a second embodiment.

(3. Other Embodiments or Modifications)

In a first embodiment described above, the case has been described in which one of the resistors 6*s* and 6*w* whose resistance values are different from each other is selectively mounted at one of the resistor mounting positions MPu and MPl. However, the invention is not limited thereto. For example, one of three or more resistors having resistance values different from one another may be selectively mounted to one of the resistor mounting positions MPu and MPl, so as to read 3 or more-bit set value per terminal.

In one or more embodiments described above, the case has been described in which the resistor 6 is used as an impedance element. However, the invention is not limited thereto. For example, in addition to the resistor 6, a coil may be added in series with the signal line L as an impedance element.

Further, in a first embodiment described above, the case has been described in which one of the resistors 6*s* and 6*w* having different resistance values from each other is mounted at either of the resistor mounting positions MPu or MPl. However, the invention is not limited thereto. For example, the semiconductor circuit 3 may be configured to include the terminal 11 to which one of a plurality of capacitors 8 having different capacitance values from each other as an impedance element can be selectively mounted to determine the set value (setting condition). The same is true for second and third embodiments described above.

Further, in a first embodiment described above, the case has been described in which one of the resistors 6*s* and 6*w* as a chip resistor is mounted at either of the resistor mounting positions MPu or MPl. However, the invention is not limited thereto. For example, a variable resistor may be mounted on either one of the resistor mounting positions MPu or MPl such that a resistance value of the variable resistor may be switched to one of 2 kΩ and 10 kΩ in accordance with the set value to be set. Similarly in the second and third embodiments described above, a variable resistor having four resistance values may be mounted such that one of the resistance values are selected in accordance with the set value to be set.

Further, in a first embodiment described above, the case has been described in which the value of the IN signal read in the first time is treated as the most significant bit in the binary number representation of the set value, and the value of the IN signal read in the second time is treated as the least significant bit in the binary number representation of the set value. However, the invention is not limited thereto. For example, an integrated circuit may be configured to treat the value of the IN signal read in the first time as the least significant bit in the binary number representation of the set value, and treat the value of the IN signal read in the second time as the most significant bit in the binary number representation of the set value.

Further, in a first embodiment described above, the case has been described in which in step SP of the set value reading processing procedure RT1 (FIG. 7) 1, at time T0, the value of the IN signal as the first signal at the first time point is read. However, the invention is not limited thereto. For example, the value of the IN signal may be read at any point in time prior to time T1. The same is true for second and third embodiments described above.

In a second embodiment described above, the case has been described in which one of the four different resistors 6*a*, 6*b*, 6*c*, and 6*d* whose resistance values are different from one another is selectively mounted at one of the resistor mounting positions MPu and MPl, and the state of the terminal is measured four times, so as to determine the set value among eight different set values per terminal. However, the invention is not limited thereto. For example, an integrated circuit may be configured to measure the state of the terminal 11 three times, in which one of three different types of resistors is selectively connected to one of the resistor mounting positions MPu and MPl, so as to determine the set value among six different set values per terminal. Further, an integrated circuit may be configured to measure the state of the terminal 11 five times or more, in which one of five or more different types of resistors is selectively connected to one of the resistor mounting positions MPu and MPl, so as to determine the set value among ten or more different set values per terminal.

In a third embodiment described above, the case has been described in which one of the four different resistors 6a, 6b, 6c, and 6d whose resistance values are different from one another is selectively mounted at one of the resistor mounting positions MPu and MPl, and the measured logic level reversal time Tu is classified into four types for each of the pull-up resistor and the pull-down resistor, so as to determine the set value (the setting condition) among eight different set values (setting conditions) per terminal. However, the invention is not limited thereto. For example, an integrated circuit may be configured to classify the measured logic level reversal time Tu in three different categories for each of the pull-up and pull-down resistor, in which one of three different resistors having resistance values different from one another is selectively mounted to one of the resistor mounting positions MPu and MPl, so as to determine the set value among six different set values per terminal. Further, an integrated circuit may be configured to classify the measured logic level reversal time Tu in five or more different categories for each of the pull-up and pull-down resistor, in which one of five or more different resistors having resistance values different from one another is selectively mounted to one of the resistor mounting positions MPu and MPl, so as to determine the set value among ten or more different set values per terminal.

Further, in a third embodiment described above, the case has been described in which the four determination ranges of the measured logic level reversal time Tu in the case where the resistor 6 is mounted to the resistor mounting position MPu are the same as in the case where the resistor 6 is mounted to the resistor mounting position MPl. However, the invention is not limited thereto. For example, the four determination ranges of the measured logic level reversal time Tu in the case where the resistor 6 is mounted to the resistor mounting position MPu may be set different from those in the case where the resistor 6 is mounted to the resistor mounting position MPl.

Further, the value of the resistance constant R of the resistor 6, the capacitance value of the capacitor 8, the clock frequency of the OSC, or the like in one or more embodiments described above are merely examples and thus other values may be used. This invention is not limited to one or more embodiments and modifications described above, but various modifications and variations can be made based on the spirit of the invention. It is accordingly not intended that such modifications and variations are excluded from the scope of the invention.

Furthermore, in one or more embodiments described above, the case has been described where the LVTTL is used as the IO buffer 12. The invention is not limited thereto. For example, various other forms of buffers, such as an LVCMOS (Low Voltage CMOS), or the like, may be used.

Further, in one or more embodiments described above, the case has been described in which the voltage of Vcc is 3.3 V. However, the invention is not limited thereto. For example, the voltage of Vcc may be any voltage, such as 5.0 V or the like.

Further, in one or more embodiments described above, the case has been described in which the technical concept is applied to the semiconductor integrated circuit 3, 103, or 203 mounted on the circuit board 2, 102, or 202 in the printer 1, 101, or 201 as an electronic apparatus. However, the invention is not limited thereto, and the disclosure may be applied to a semiconductor integrated circuit on a circuit board in any one of electronic apparatuses, such as an MFP (Multi-Function Peripheral) having functions of a copier, and a facsimile, and various other electronic apparatuses.

Furthermore, the invention is not limited to one or more embodiments and modifications described above. That is, the application range of the invention covers embodiments obtained by arbitrarily combining some of or all of one or more embodiments and modifications described above. The invention also applies to a case where a part of the configuration in any one of one or more embodiments and modifications described above that is extracted is replaced or diverted with a part of the configuration of any one of one or more embodiments and modifications, or the extracted part is added to any of one or more embodiments and modifications described above.

The invention may be used, for example, in an integrated circuit mounted on a circuit board in a printer.

The invention includes other embodiments or modifications in addition to one or more embodiments and modifications described above without departing from the spirit of the invention. The one or more embodiments and modifications described above are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. An integrated circuit comprising:
a terminal to which an impedance element and a power supply having a predetermined potential can be connected, wherein
the integrated circuit is configured to change a potential of one of electrodes of the impedance element connected to the terminal, detect a change in electrical characteristics of the terminal based on characteristics of the impedance element when the potential of the one electrode of the impedance element is changed, to determine a setting condition among a plurality of setting conditions that are used for an operation of the integrated circuit, and store the setting condition in a storage,
the integrated circuit is configured to use the setting condition stored in the storage for the operation of the integrated circuit,
the integrated circuit comprises: a signal input part that is configured to receive a signal through the terminal; and a control unit configured to control a signal output part that is electrically connected to the one electrode of the impedance element and is configured to output a signal to change the potential of the one electrode, wherein the control unit is configured to detect a first transition state of the electrical characteristics of the terminal and a second transition state of the electrical characteristics of the terminal after the first transition state in response to the control of the signal output part, and determine the setting condition among the plurality of setting conditions based on the detected first transition state and second transition state, and
the control unit is configured to: (i) receive a first signal from the signal input part while stopping the output of the signal output part; (ii) after the first signal is received, output from the signal output part a second signal whose electrical characteristics are different from those of the first signal; (iii) after the second signal is output, stop the output of the signal output part; (iv) after a predetermined condition is satisfied after the output of the signal output part is stopped, receive a third signal from the signal input part; and (v) store a first part of the setting condition corresponding to the received first signal and a second part of the setting condition corresponding to the received third signal in the storage.

2. The integrated circuit according to claim 1, wherein the impedance element is one of a pull-up resistor and a pull-down resistor,
the terminal is connected to the power supply through the pull-up resistor or to a ground potential through the pull-down resistor, and
each of the pull-up resistor and the pull-down resistor has a plurality of resistance values different from each other.

3. The integrated circuit according to claim 2, wherein the control unit is configured to determine the setting condition among the plurality of setting conditions, according to the change in the potential of the terminal based on a resistance value of the one of the pull-up resistor having two different resistance values and the pull-down resistor having two different resistance values that is selectively connected to the terminal.

4. The integrated circuit according to claim 3, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after a predetermined time length has elapsed after the output of the signal output part is stopped, receive the third signal from the signal input part; and (v) store the first part of the setting condition corresponding to the received first signal and the second part of the setting condition corresponding to the received third signal in the storage.

5. The integrated circuit according to claim 4, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after the predetermined time length has elapsed after the output of the signal output part is stopped, receive the third signal from the signal input part; and (v) store the first part of the setting condition corresponding to the received first signal and the second part of the setting condition corresponding to the received third signal in the storage, wherein the third signal has characteristics in which, the greater the resistance value of the one of the pull-up resistor and the pull-down resistor that is selectively connected to the terminal, the smaller the change in the potential according to the elapsed time after the second signal is output.

6. The integrated circuit according to claim 5, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after the predetermined time length has elapsed after the output of the signal output part is stopped, receive the third signal from the signal input part; and (v) store in the storage the setting condition which is a 2-bit setting condition obtained by a combination of one bit according to a potential of the received first signal and another bit according to a potential of the received third signal, wherein the third signal has characteristics in which, the greater the resistance value of the one of the pull-up resistor and the pull-down resistor that is selectively connected to the terminal, the smaller the change in the potential according to the elapsed time after outputting the second signal.

7. The integrated circuit according to claim 2, wherein the control unit is configured to determine the setting condition among the plurality of setting conditions, according to the change in the potential of the terminal based on a resistance value of the one of the pull-up resistor having two or more different resistance values and the pull-down resistor having two or more different resistance values that is selectively connected to the terminal.

8. The integrated circuit according to claim 7, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after a predetermined time length has elapsed after the output of the signal output part is stopped, receive the third signal from the signal input part; and (v) store the first part of the setting condition corresponding to the received first signal and the second part of the setting condition corresponding to the received third signal in the storage.

9. The integrated circuit according to claim 8, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after the predetermined time length has elapsed after the output of the signal output part is stopped, receive the third signal from the signal input part; and (v) store the first part of the setting condition corresponding to the received first signal and the second part of the setting condition corresponding to the received third signal in the storage, wherein the third signal has characteristics in which, the greater the resistance value of the one of the pull-up resistor and the pull-down resistor that is selectively connected to the terminal, the smaller the change in the potential according to the elapsed time after the second signal is output.

10. The integrated circuit according to claim 9, wherein the control unit is configured to: (i) receive the first signal from the signal input part while stopping the output of the signal output part; (ii) after receiving the first signal, output from the signal output part the second signal whose logic level is different from that of the first signal; (iii) after the second signal is output, stop the output of the signal output part; (iv) after the predetermined time length has elapsed after the output of the signal output part is stopped, receive the third signal from the signal input part; (v) after a predetermined time length has elapsed after the third signal is received, receive a fourth signal; and (vi) store in the storage the setting condition which is a 2 or more-bit setting condition per the terminal determined based on potentials of the received first, third, and fourth signals, wherein the third signal has characteristics in which, the greater the resistance value of the one of the pull-up resistor and the pull-down resistor that is selectively connected to the terminal, the smaller the change in the potential according to the elapsed time after the second signal is output, and wherein the fourth signal has characteristics in which, the greater the resistance value of the one of the pull-up resistor and the pull-down resistor that is selectively connected to the terminal, the smaller the change in the potential according to the elapsed time after the second signal is output.

11. The integrated circuit according to claim 9, wherein the control unit is configured to: (i) receive the first signal from the signal input part while stopping the output of the signal output part; (ii) after the first signal is received, output from the signal output part the second signal whose logic level is different from that of the first signal; (iii) after the second signal is output, stop the output of the signal output part; (iv) after the output of the signal output part is stopped, receive the third signal from the signal input part; and (v) store in the storage the setting condition which is a 2 or more-bit setting condition per the terminal determined based on a potential of the received first signal and a time length from a time when the output of the second signal from the signal output part is stopped after the second signal is output to a time when a logic level of the third signal is changed, wherein the third signal has characteristics in which the higher the resistance value of the one of the pull-up resistor and the pull-down resistor that is selectively connected to the terminal, the smaller the change in the potential according to the elapsed time after the second signal is output.

12. A circuit board comprising:
the integrated circuit according to claim 1;
the impedance element connected to the terminal of the integrated circuit; and
the power supply connected to the impedance element.

13. A circuit board comprising:
the integrated circuit according to claim 1;
a plurality of impedance element mounting positions to each of which the impedance element can be mounted; and
the power supply connected to the plurality of impedance element mounting positions, wherein
the integrated circuit is configured to determine the setting condition among the plurality of setting conditions based on the characteristics of the impedance element that is mounted to one of the plurality of impedance element mounting positions.

14. A circuit board comprising:
the integrated circuit according to claim 1; and
at least one impedance element mounting position to which the impedance element, which is a variable impedance element whose impedance is configured to be selectively set, can be mounted; and
the power supply connected to the at least one impedance element mounting position, wherein
the integrated circuit is configured to determine the setting condition among the plurality of setting conditions based on a selectively set impedance of the variable impedance element that is mounted to the at least one impedance element mounting position.

15. An electronic apparatus comprising:
the circuit board according to claim 12; and
a device configured to be operated by the integrated circuit of the circuit board.

\* \* \* \* \*